US011849639B2

(12) United States Patent
Gardner et al.

(10) Patent No.: US 11,849,639 B2
(45) Date of Patent: Dec. 19, 2023

(54) FORMING SEMICONDUCTOR-SUPERCONDUCTOR HYBRID DEVICES WITH A HORIZONTALLY-CONFINED CHANNEL

(71) Applicant: Microsoft Technology Licensing, LLC, Redmond, WA (US)

(72) Inventors: Geoffrey Charles Gardner, West Lafayette, IN (US); Sergei Vyatcheslavovich Gronin, West Lafayette, IN (US); Flavio Griggio, Seattle, WA (US); Raymond Leonard Kallaher, West Lafayette, IN (US); Noah Seth Clay, West Lafayette, IN (US); Michael James Manfra, West Lafayette, IN (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 114 days.

(21) Appl. No.: 17/532,908

(22) Filed: Nov. 22, 2021

(65) Prior Publication Data

US 2023/0165166 A1  May 25, 2023

(51) Int. Cl.
*H10N 60/10* (2023.01)
*H10N 60/01* (2023.01)

(52) U.S. Cl.
CPC ....... *H10N 60/0184* (2023.02); *H10N 60/128* (2023.02)

(58) Field of Classification Search
CPC ... H10N 60/128; H10N 60/205; H10N 60/207
See application file for complete search history.

(56) References Cited

U.S. PATENT DOCUMENTS

| 10,978,632 B2 | 4/2021 | Kallaher et al. |
| 11,121,303 B2 | 9/2021 | Cassidy et al. |

(Continued)

FOREIGN PATENT DOCUMENTS

| WO | 2019074557 A1 | 4/2019 |
| WO | 2023091232 A1 | 5/2023 |

OTHER PUBLICATIONS

Manfra, Michaelj., "Molecular Beam Epitaxy of Ultra-High Quality AlGaAs/GaAs Heterostructures: Enabling Physics in Low-Dimensional Electronic Systems", In Repository of arXiv:1309.2717v1, Sep. 11, 2013, 60 Pages.

(Continued)

*Primary Examiner* — Jae Lee
(74) *Attorney, Agent, or Firm* — Ranjeev Singh; Singh Law, PLLC

(57) ABSTRACT

Methods of forming semiconductor-superconductor hybrid devices with a horizontally-confined channel are described. An example method includes forming a first isolated semiconductor heterostructure and a second isolated semiconductor heterostructure. The method further includes forming a left gate adjacent to a first side of each of the first isolated semiconductor heterostructure and the second isolated semiconductor heterostructure. The method further includes forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. The method further includes forming a superconducting layer over each of the first isolated semiconduc- (Continued)

tor heterostructure and the second isolated semiconductor heterostructure.

20 Claims, 20 Drawing Sheets

(56) References Cited

U.S. PATENT DOCUMENTS

| | | |
|---|---|---|
| 11,127,820 B2 | 9/2021 | Manfra et al. |
| 11,316,022 B2 * | 4/2022 | Holmes ............... H01L 29/0673 |
| 2021/0091294 A1 * | 3/2021 | Thomas ............. H10N 60/0912 |
| 2021/0210599 A1 | 7/2021 | Gardner et al. |
| 2021/0280763 A1 | 9/2021 | Gardner et al. |
| 2022/0139770 A1 * | 5/2022 | Ritter ................ H01L 21/02645 |
| | | 438/405 |

OTHER PUBLICATIONS

Pauka, et al., "Repairing the Surface of InAs-based Topological Heterostructures", In Journal of Applied Physics, vol. 128, Issue 11, Sep. 15, 2020, 8 Pages.

Sai, et al., "AlGaN/GaN Field Effect Transistor with Two Lateral Schottky Barrier Gates Towards Resonant Detection in sub-mm Range", In Journal of Semiconductor Science and Technology, vol. 34, Issue 2, Jan. 7, 2019, 7 Pages.

Shorubalko, et al., "Self-Aligned Charge Read-Out for InAs Nanowire Quantum Dots", In Repository of arXiv:0712.1705v1, Dec. 11, 2007, 11 Pages.

"International Search Report and Written Opinion Issued in PCT Application No. PCT/US2022/044068", dated Nov. 3, 2023, 14 Pages.

* cited by examiner

```
┌─────────────────────────────────────────────────────────────────┐
│  FORMING A FIRST ISOLATED SEMICONDUCTOR HETEROSTRUCTURE AND A    │
│  SECOND ISOLATED SEMICONDUCTOR HETEROSTRUCTURE OVER A SUBSTRATE  │
└─────────────────────────────────────────────────────────────────┘
                                │
                                │  ⟩ 2010
                                ▼
┌─────────────────────────────────────────────────────────────────┐
│  FORMING A LEFT GATE ADJACENT TO A FIRST SIDE OF EACH OF THE     │
│  FIRST ISOLATED SEMICONDUCTOR HETEROSTRUCTURE AND THE SECOND     │
│  ISOLATED SEMICONDUCTOR HETEROSTRUCTURE                          │
└─────────────────────────────────────────────────────────────────┘
                                │
                                │  ⟩ 2020
                                ▼
┌─────────────────────────────────────────────────────────────────┐
│  FORMING A RIGHT GATE ADJACENT TO A SECOND SIDE, OPPOSITE TO THE │
│  FIRST SIDE, OF EACH OF THE FIRST ISOLATED SEMICONDUCTOR         │
│  HETEROSTRUCTURE AND THE SECOND ISOLATED SEMICONDUCTOR           │
│  HETEROSTRUCTURE, WHERE A TOP SURFACE OF EACH OF THE LEFT GATE   │
│  AND THE RIGHT GATE IS OFFSET VERTICALLY FROM A SELECTED SURFACE │
│  OF EACH OF THE FIRST ISOLATED SEMICONDUCTOR HETEROSTRUCTURE AND │
│  THE SECOND ISOLATED SEMICONDUCTOR HETEROSTRUCTURE BY A          │
│  PREDETERMINED OFFSET AMOUNT                                     │
└─────────────────────────────────────────────────────────────────┘
                                │
                                │  ⟩ 2030
                                ▼
┌─────────────────────────────────────────────────────────────────┐
│  FORMING A SUPERCONDUCTING LAYER OVER EACH OF THE FIRST ISOLATED │
│  SEMICONDUCTOR HETEROSTRUCTURE AND THE SECOND ISOLATED           │
│  SEMICONDUCTOR HETEROSTRUCTURE                                   │
└─────────────────────────────────────────────────────────────────┘
                                    ⟩ 2040
                         2000
```

FIG. 20

FORMING SEMICONDUCTOR-SUPERCONDUCTOR HYBRID DEVICES WITH A HORIZONTALLY-CONFINED CHANNEL

BACKGROUND

Devices, such as topological nanowires, are currently fabricated by defining the wire electrostatically from top down by patterning a superconductor formed in a wafer. The patterning of the superconductor defines the electrostatic potential for the channel associated with the nanowire. The patterning of the superconductor, however, makes the electrostatic potential of the channel subject to the line edge roughness (LER) of the superconductor, which in turn decreases the size of the topological gap. In addition, because the electrostatic channel is formed close to the surface of the wafer, it is subject to charge scattering effects.

Accordingly, there is a need for improved devices that are less susceptible to charge scattering effects and are not subject to the LER of the patterned superconductor.

SUMMARY

In one aspect, the present disclosure relates to a method for forming a semiconductor-superconductor hybrid device including forming a first isolated semiconductor heterostructure and a second isolated semiconductor heterostructure over a substrate. The method may further include forming a left gate adjacent to a first side of each of the first isolated semiconductor heterostructure and the second isolated semiconductor heterostructure. The method may further include forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. The method may further include forming a superconducting layer over each of the first isolated semiconductor heterostructure and the second isolated semiconductor heterostructure.

In another aspect, the present disclosure relates to a method for forming a semiconductor-superconductor hybrid device including forming a first isolated semiconductor heterostructure and a second isolated semiconductor heterostructure over a substrate. The method may further include forming a left gate adjacent to a first side of each of the first isolated semiconductor heterostructure and the second isolated semiconductor heterostructure and forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. The method may further include forming a superconducting layer over each of the first isolated semiconductor heterostructure and the second isolated semiconductor heterostructure, where the semiconductor-superconductor hybrid device is configured to form a horizontally-confined electrostatic channel responsive to an application of an electric field via a respective left gate and a right gate associated with a respective isolated semiconductor heterostructure.

In yet another aspect, the present disclosure relates to a method for forming a semiconductor-superconductor hybrid device including forming a semiconductor heterostructure over a substrate. The method may further include forming a superconducting layer over the semiconductor heterostructure. The method may further include exposing a first side of the semiconductor heterostructure and a second side, opposite to the first side, of the semiconductor heterostructure to allow for a formation of a first gate adjacent to the first side of the semiconductor heterostructure and for a formation of a second gate adjacent to the second side of the semiconductor heterostructure. The method may further include removing a first portion of the first gate and a second portion of the second gate such that each of a first top surface of the first gate and a second top surface of the second gate is offset vertically from a selected surface of the semiconductor heterostructure by a predetermined offset amount.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

FIG. 20 shows another flowchart of a method for forming a semiconductor-superconductor hybrid device in accordance with one example.

DETAILED DESCRIPTION

Figure 1:
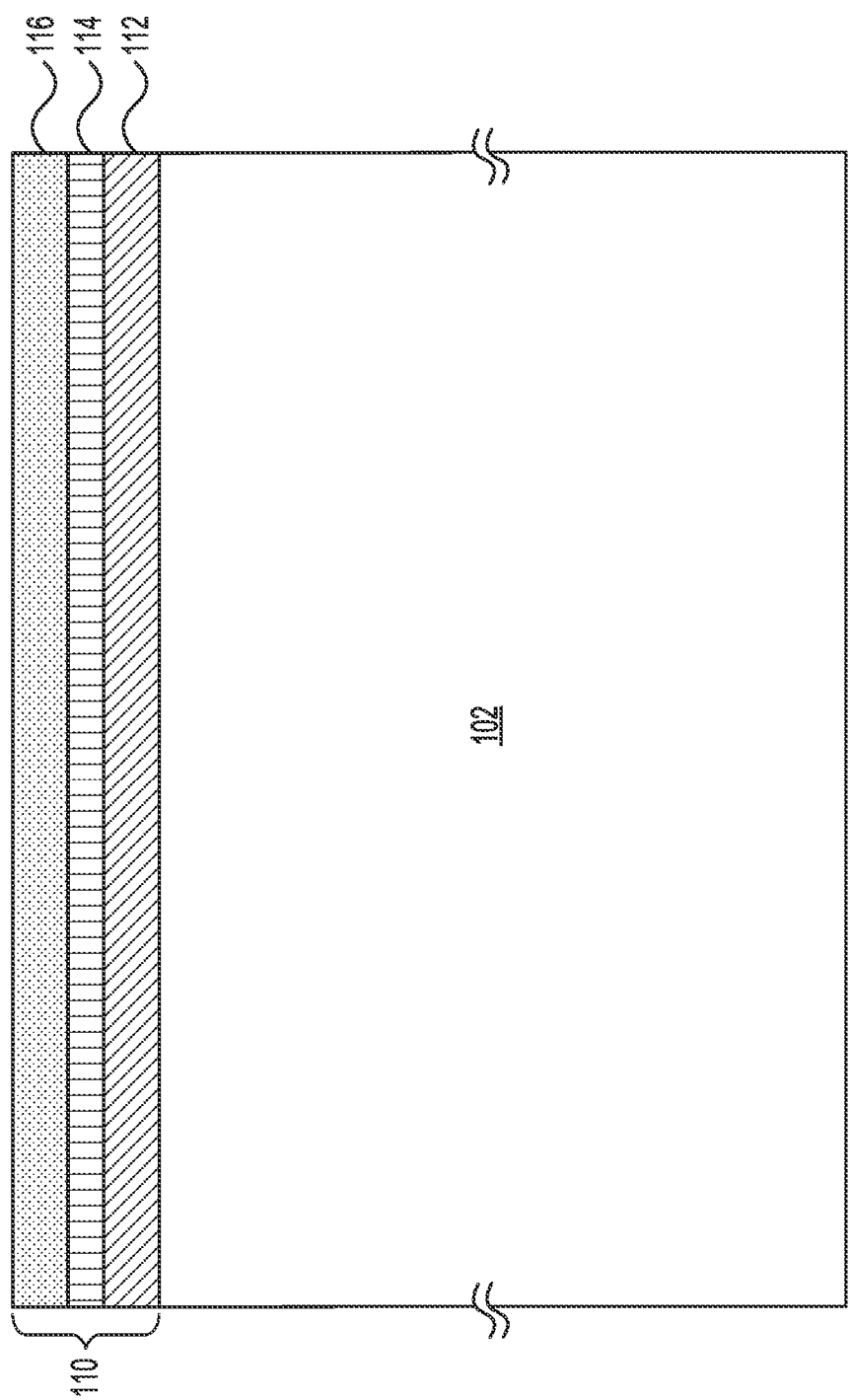
FIG. 1 shows a view of an example semiconductor-superconductor hybrid device at a stage in processing.

Examples described in this disclosure relate to methods of forming semiconductor-superconductor hybrid devices with a horizontally-confined channel. Certain examples relate to semiconductor-superconductor hybrid devices that may horizontally confine an electrostatic channel (e.g., a 2-dimensional electron gas (2-DEG) channel) in a semiconductor heterostructure. Certain examples further relate to topological nanowires that may be implemented using the confined horizontally-confined electrostatic channels. Such semiconductor heterostructures may be formed using materials from group III and group V of the periodic table. In addition, such semiconductor heterostructures may also be formed using materials from group II, group IV, or group VI of the periodic table. The topological nanowires may be formed using chemical beam epitaxy or molecular beam epitaxy and then may be transferred to a substrate to form source, drain, and gate aspects of the devices. In addition, these materials may be used to form topological nanowires using selective area growth (SAG) techniques.

Example devices may be formed using in-situ growth of various materials on a semiconductor wafer. Example semiconductor wafers include wafers formed using any of indium phosphide (InP), indium arsenide (InAs), indium antimonide (InSb), mercury cadmium telluride (HgCdTe), or any appropriate combination of materials selected from groups II, III, IV, V, and VI of the periodic table, or any ternary compounds of three different atoms of materials selected from groups II, III, IV, V, and VI of the periodic table. As an example, the wafers may be formed by epitaxial growth of any of these combination of materials on a substrate. Topological nanowires may be formed on such wafers by forming a superconductor-semiconductor interface.

During the formation of such devices, a mask (or masks) may be used to define the topologically active areas of the device. The topologically active areas may include quantum wells, e.g., InAs quantum wells or GaAs quantum wells. For such devices, the interface between the topologically active areas (including a superconducting metal layer (e.g., an aluminum layer)) and the topologically inactive areas (not including a metal layer (e.g., an aluminum layer)) is important. In-situ deposition of a superconductor such as epitaxially grown aluminum directly after the semiconductor growth results in an improvement in the quality of the superconducting gap. However, this technique poses additional fabrication challenges. As an example, the aluminum must be removed to define the topological region of the device. Wet etch solutions selective to aluminum are highly exothermic and they can damage the semiconductor. Such damage to the semiconductor results in increased line edge roughness (LER) of the superconductor which in turn decreases the size of the topological gap.

In addition, the etching step damages the interface between the topologically active areas and the topologically inactive areas. Some of this damage corresponds to charged surface states that may interfere with the operation of the device. This is because the quantum wells are formed at a shallow depth (e.g., approximately within 10 nm of the surface). The charged surface states may interfere with the quality of the 2-DEG. Similarly, other structures, such as nanowires grown using the VLS method, may also be damaged.

FIG. 1 shows a view 100 of an example semiconductor-superconductor hybrid device 10 at a stage in processing. In this example, as part of this step, a semiconductor heterostructure 110 may be formed on a substrate 102. Substrate 102 may be any type of suitable substrate, including an indium phosphide (InP) substrate. Semiconductor heterostructure 110 may include a buffer layer 112 and a quantum well layer 114. Semiconductor heterostructure 110 may further include another buffer layer 116 formed on top of quantum well layer 114 to complete the formation of the heterostructure corresponding to one or more superconducting quantum wells. Each of these layers may be formed using molecular-beam epitaxy (MBE). As an example, the MBE related process may be performed in an MBE system that allows the deposition of the appropriate materials (e.g., III-V semiconductor materials) in a vacuum. Buffer layer 116 may not be necessary to complete the formation of certain types of quantum wells.

In this example, substrate 102 may be an indium phosphide (InP) substrate. Buffer layer 112 may be an indium gallium arsenide (InGaAs) layer. Quantum well layer 114 may be an indium arsenide (InAs) layer. Buffer layer 116 may be an indium aluminum arsenide (InAlAs) layer. Although FIG. 1 shows a certain number of layers of semiconductor-superconductor hybrid device 10 arranged in a certain manner, there could be more or fewer numbers of layers arranged differently. As an example, substrate 102 may comprise indium arsenide, indium antimonide, indium arsenide antimonide, or like substrate materials. Moreover, each buffer layer may comprise other materials, including aluminum, lead, niobium, tin, tantalum, or vanadium. Also, each buffer layer need not comprise the same set of materials and may include different materials. In one example, the semiconductor heterostructure may include a first layer of indium arsenide or aluminum arsenide, a second layer of indium arsenide, and a third layer of indium arsenide or gallium arsenide. In addition, although FIG. 1 does not show a capping layer, a capping layer may be formed on semiconductor heterostructure 110 to protect the semiconductor heterostructure's top surface from oxidation or other processing induced changes. Such a capping layer may be a gallium arsenide layer or an aluminum arsenide layer. Other materials that may help protect the semiconductor heterostructure may include materials such as aluminum oxide, niobium, or other suitable materials. In addition, semiconductor-superconductor hybrid device 10 may include additional or fewer intervening layers other than shown in FIG. 1. As an example, semiconductor-superconductor hybrid device 10 may be formed as a one-dimensional nanowire.

Figure 2:
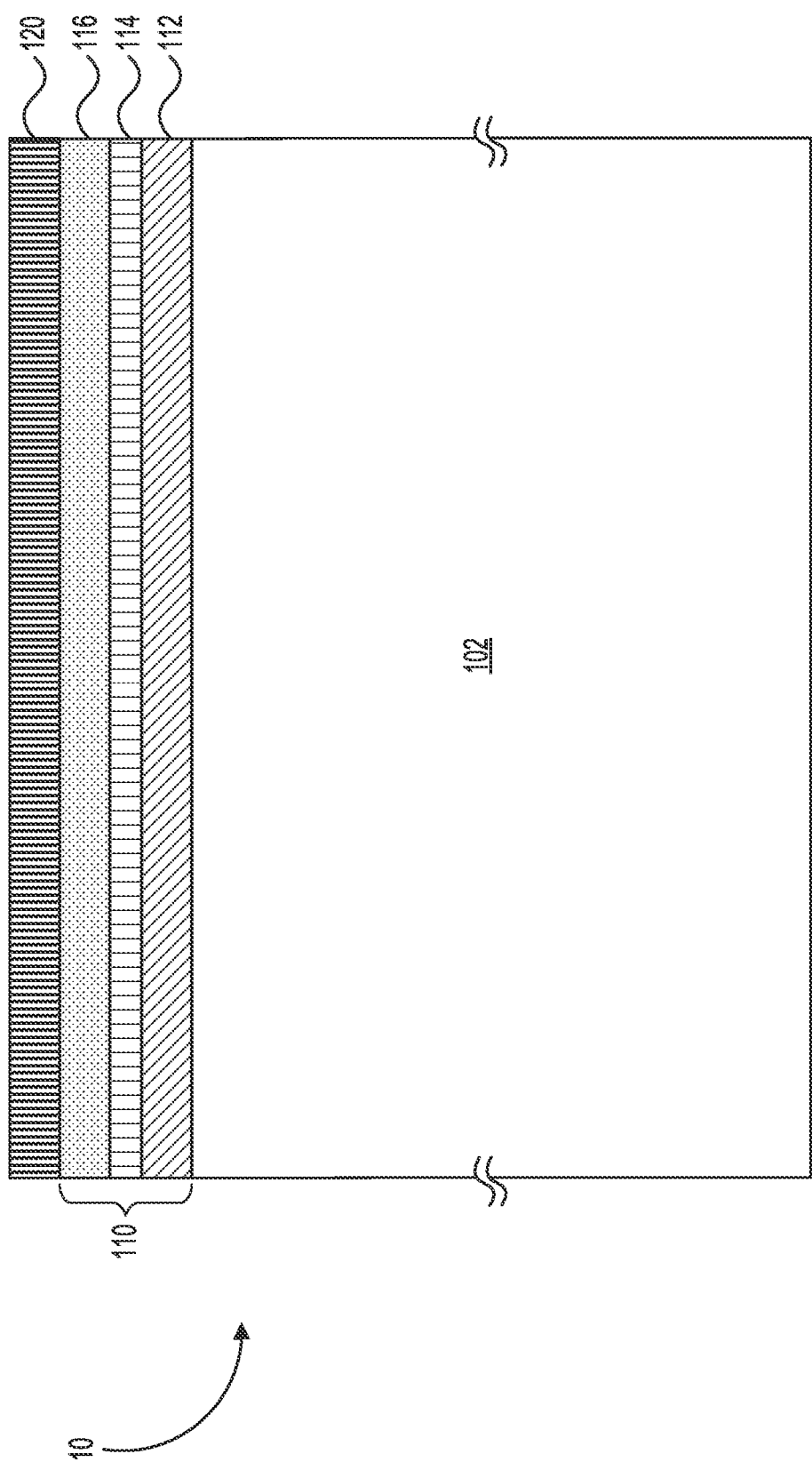
FIG. 2 shows a view of the example semiconductor-superconductor hybrid device of FIG. 1 at a subsequent stage in processing.

FIG. 2 shows a view 200 of the example semiconductor-superconductor hybrid device 10 of FIG. 1 at a subsequent stage in processing. At this stage of the processing, a superconducting metal layer 120 may be formed on top of semiconductor heterostructure 110. In this example, superconducting metal layer 120 may be deposited using MBE. Any superconductors that demonstrate periodicity for electronic pairing related to the existence of Cooper pairs may be used to form superconducting metal layer 120. Example materials that could be used to form superconducting metal layer 120 include, but are not limited to, lead, indium, tin, and aluminum. Although FIG. 2 shows a certain number of layers of semiconductor-superconductor hybrid device 10 arranged in a certain manner, there could be more or fewer numbers of layers arranged differently.

Figure 3:
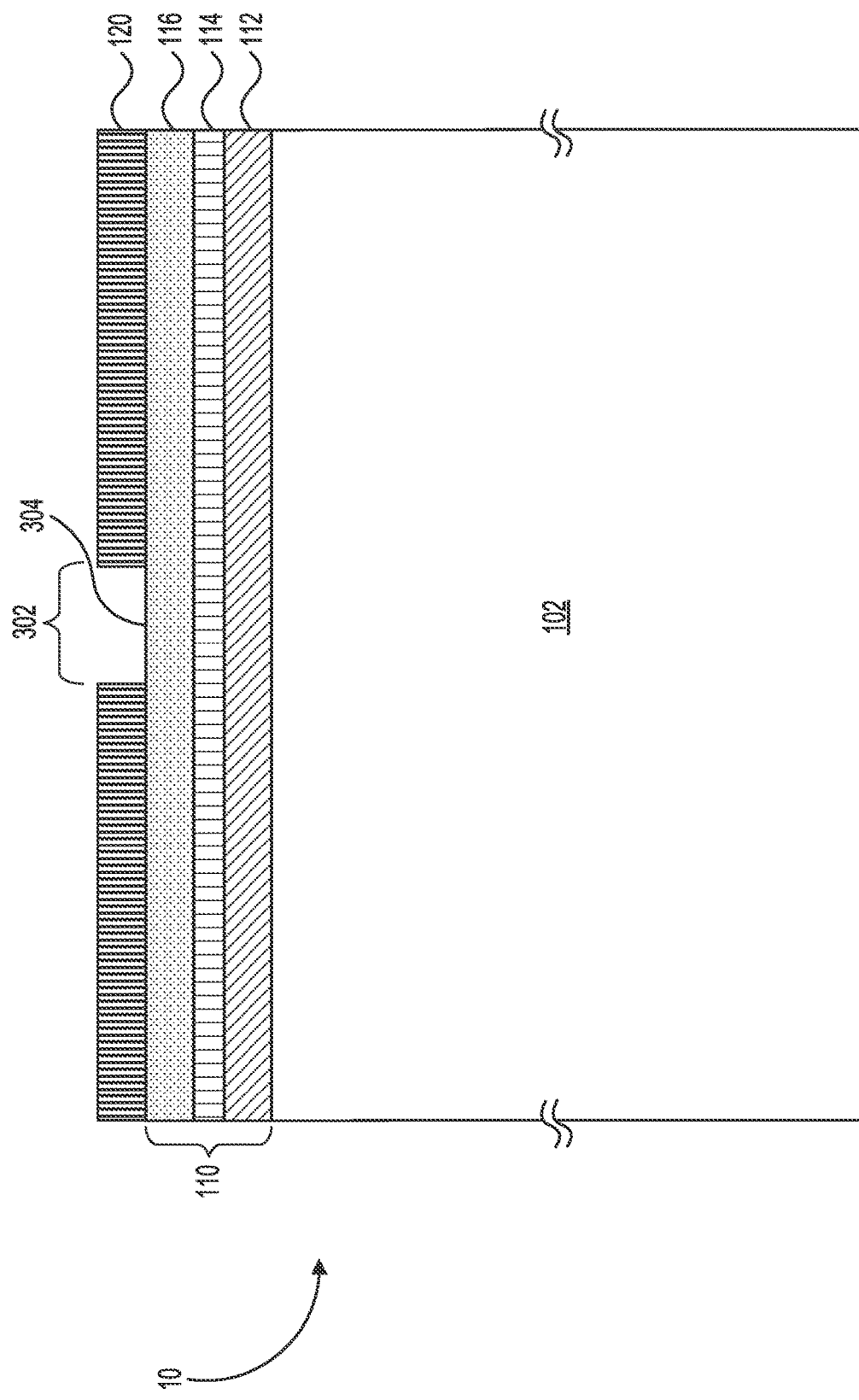
FIG. 3 shows a view of the example semiconductor-superconductor hybrid device of FIG. 2 at a subsequent stage in processing.

FIG. 3 shows a view 300 of the example semiconductor-superconductor hybrid device 10 of FIG. 2 at a subsequent stage in processing. As part of this step, a portion 302 of superconducting metal layer 120 may be selectively removed. This step may be performed using a wet etch or a dry etch. A mask may be used to define the topologically active areas of the topological quantum computing device. The topologically active areas may include quantum wells, e.g., InAs quantum wells or GaAs quantum wells. For topological quantum computing purposes, the interface between the topologically active areas (including a metal layer (e.g., an aluminum layer)) and the topologically inactive areas (not including a metal layer (e.g., an aluminum layer)) is important. The etching step may damage a surface (e.g., 304) of portion 302 of superconducting metal layer 120 that is exposed as a result of the etching step, including the interface between the topologically active areas and the topologically inactive areas. Some of this damage corresponds to charged surface states that may interfere with the operation of semiconductor-superconductor hybrid device 10. This is because the quantum wells (or similar structures) are formed at a shallow depth (e.g., approximately within 10 nm of the surface). The charged surface states may interfere with the quality of the electrostatic channel (e.g., a 2-DEG channel). Similarly, other structures, such as nanowires grown using the VLS method or the SAG method, may be damaged.

Figure 4:
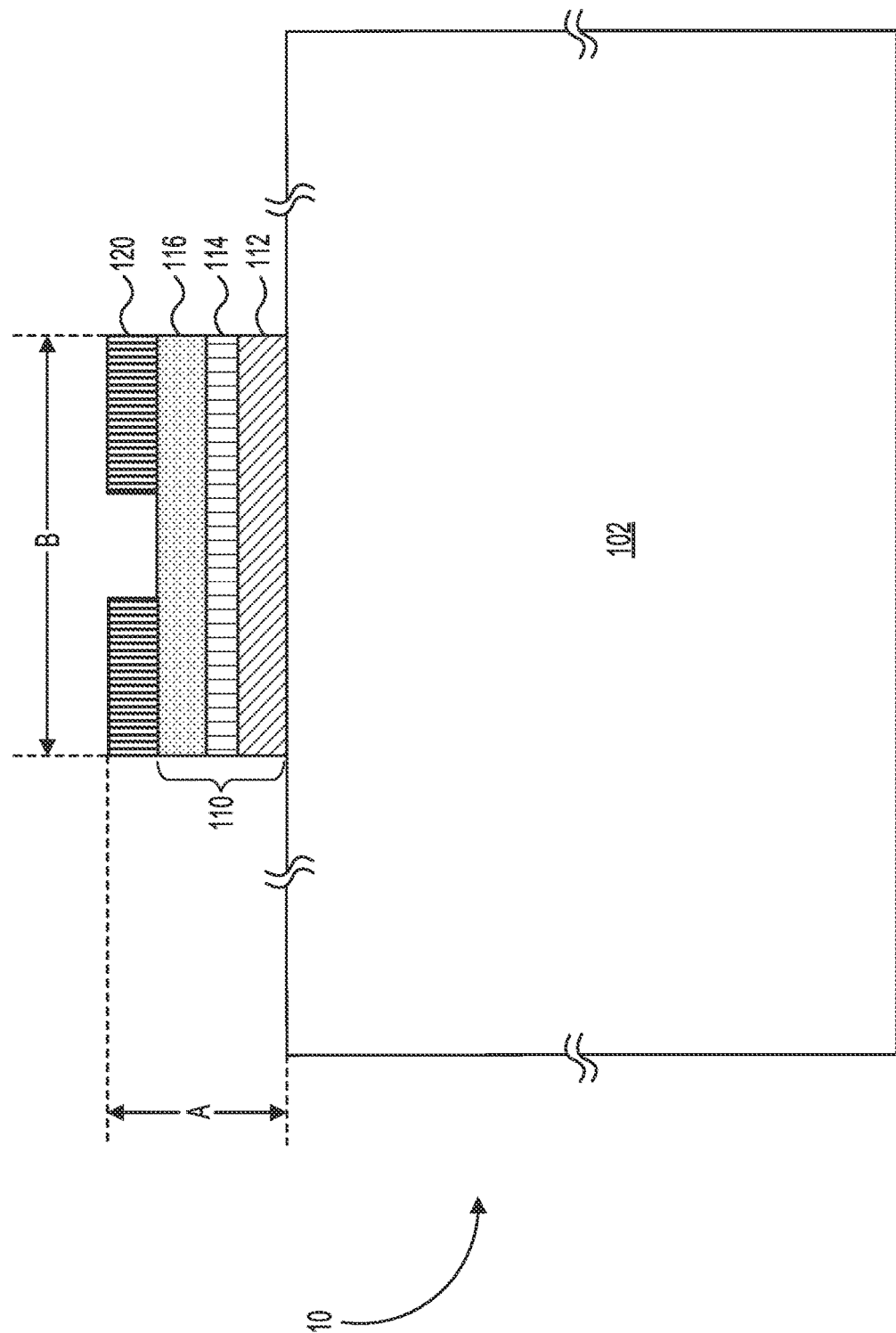
FIG. 4 shows a view of the example semiconductor-superconductor hybrid device of FIG. 3 at a subsequent stage in processing.

FIG. 4 shows a view 400 of the example semiconductor-superconductor hybrid device 10 of FIG. 3 at a subsequent stage in processing. At this stage of the processing, each side of semiconductor heterostructure 110 may be selectively etched away to expose the sides. In addition, each side of superconducting metal layer 120 may also be removed as part of this step. The selective removal of these materials may be performed using a wet etch or a dry etch. In this example, the selective removal of these materials results in the formation of a semiconductor-superconductor hybrid structure with certain aspect ratio defined by a ratio of its width (B) to depth (A). In one example, assuming the value of width B is 100 nm and the value of depth A is 100 nm, then that would result in an aspect ratio of 1. The aspect ratio, however, need not be 1 and can be less than 1 or greater than 1. Process node size and associated technical constraints may determine the aspect ratio and the respective values for depth A and width B. In this example, the purpose of exposing the sides is to allow the formation of a gate on each side of semiconductor heterostructure 110.

Figure 5:
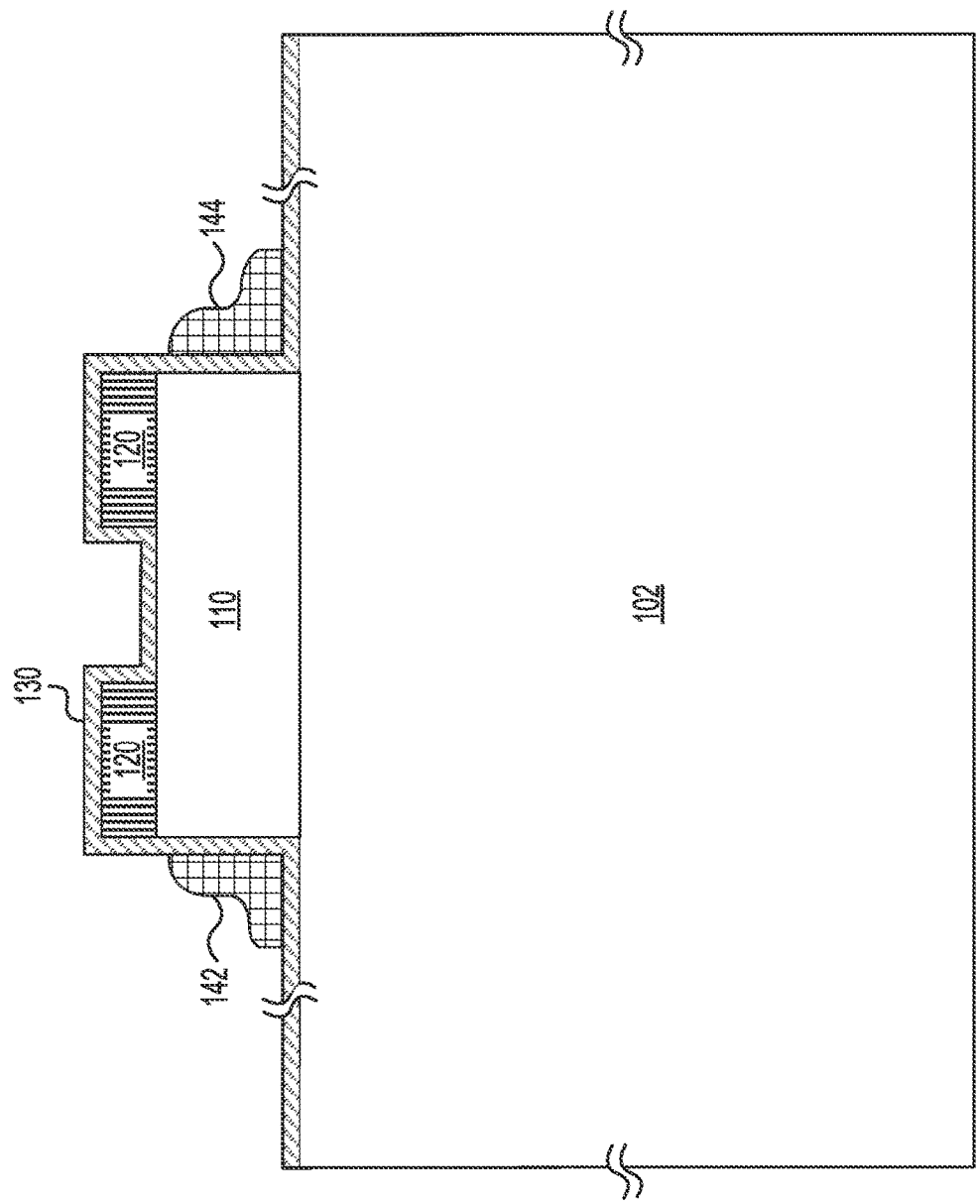
FIG. 5 shows a view of the example semiconductor-superconductor hybrid device of FIG. 4 at a subsequent stage in processing.

FIG. 5 shows a view 500 of the example semiconductor-superconductor hybrid device 10 of FIG. 4 at a subsequent stage in processing. At this stage of the processing, two steps may be performed. First, a dielectric layer 130 may be formed as shown in FIG. 5. Second, gates 142 and 144 may be formed, as shown in FIG. 5. Dielectric layer 130 may be deposited (or otherwise formed) conformally on a top surface of semiconductor-superconductor hybrid device 10 of FIG. 4 using techniques such as atomic layer deposition. Materials used to form dielectric layer 130 may include oxides (e.g., aluminum oxide or hafnium oxide) or nitrides. In addition, spin-on dielectrics, such as polyimides may also be used to form dielectric layer 130. Example organic-based dielectric layer materials may include hydrogen silsesquioxane (HSQ), benzocyclobutene (BCB), or the like. Such materials may need curing and additional processing. Each of gates 142 and 144 may be formed using materials such as gold or titanium gold. Other materials may also be used. The gates may be formed such that each of the left gate (e.g., gate 142) and the right gate (e.g., gate 144) is offset vertically from the selected surface (e.g., a top surface) of the semiconductor heterostructure by a predetermined offset amount. Additional details regarding the arrangement of the gates and the offset are provided with respect to FIG. 6 and related description. Although FIG. 5 shows a certain number of layers of semiconductor-superconductor hybrid device 10 arranged in a certain manner, there could be more or fewer numbers of layers arranged differently.

Figure 6:
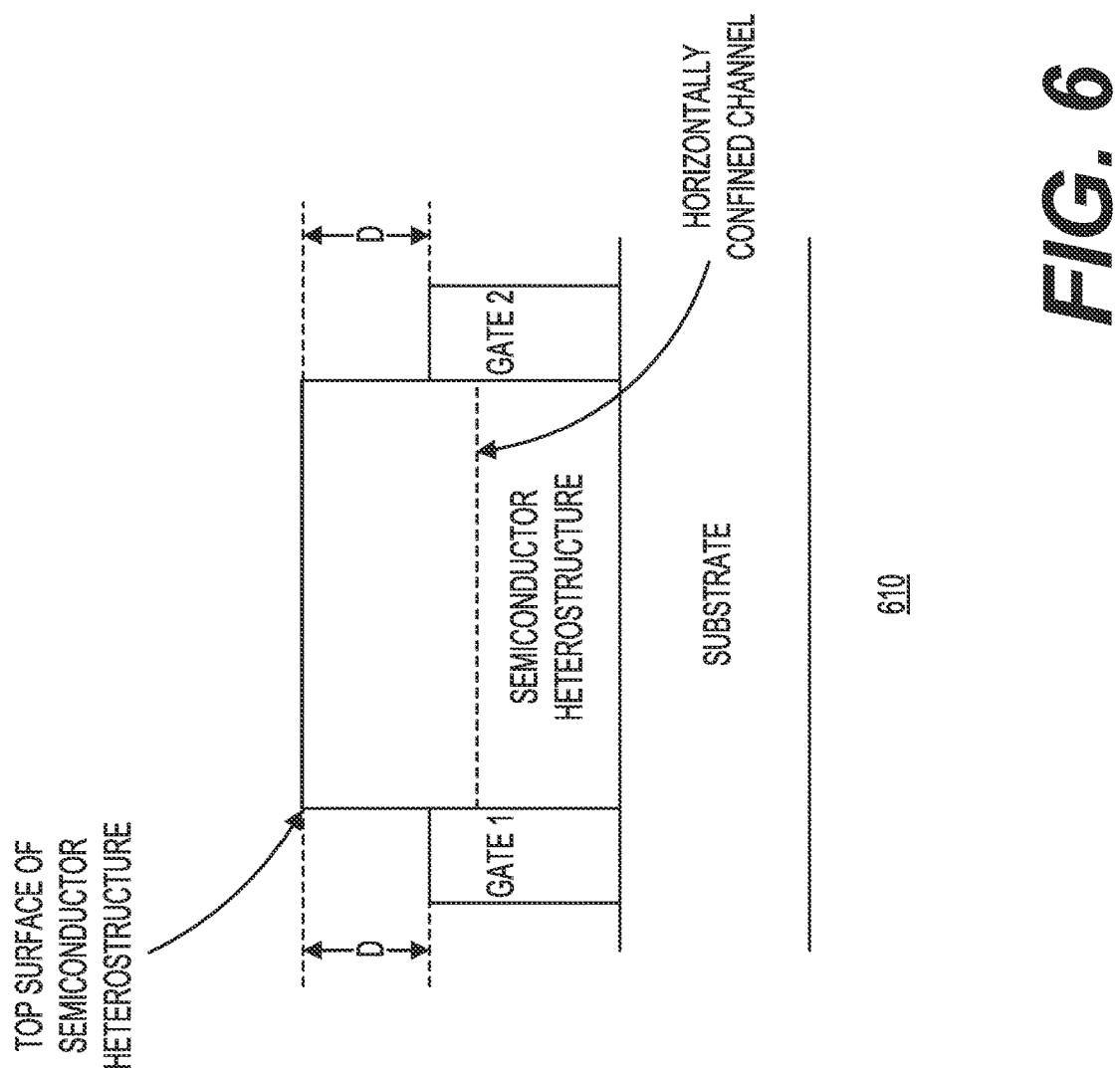
FIG. 6 illustrates the operation of the example semiconductor-superconductor hybrid devices described herein, including the semiconductor-superconductor hybrid device of FIG. 5 that includes a horizontally-confined channel.

FIG. 6 illustrates the operation of the example semiconductor-superconductor hybrid devices described herein, including semiconductor-superconductor hybrid device 10 of FIG. 5 that includes a horizontally-confined channel. The operation is explained in terms of the horizontal confinement of an electrostatic channel and the tunability aspects associated with semiconductor-superconductor hybrid device 10, particularly when used as a nanowire. View 610 shows a side view of semiconductor-superconductor hybrid device 10 and view 620 shows a top view of semiconductor-superconductor hybrid device 10. Each of these views are merely used to illustrate the operation of semiconductor-superconductor hybrid device 10 with a horizontally-confined electrostatic channel and are not intended to limit the various ways such a device may be formed. As explained earlier, the patterning of the superconductor (e.g., superconducting metal layer 120) makes the electrostatic potential of the channel subject to the line edge roughness (LER) (e.g., the LER associated with a superconductor formed over the TOP SURFACE OF SEMICONDUCTOR HETEROSTRUCTURE shown in FIG. 6) of the superconductor, which in turn decreases the size of the topological gap. In addition, because in traditional devices, the electrostatic channel is formed close to the surface of the wafer, the channel is subject to charge scattering effects. The gates (e.g., GATE1 and GATE2) formed on each side of the semiconductor heterostructure, however, create a horizontally-confined electrostatic channel (e.g., the HORIZONTALLY-CONFINED CHANNEL (dotted lines) shown in FIG. 6) that is located further away from the top surface of the semiconductor heterostructure. This, in turn, results in the electrons in the electrostatic channel to be away from the structural disorder (e.g., the roughness and/or the variation in the thickness of the top barrier) caused by the etching step described earlier. Improvements in the quality of the electrostatic channel as a result of the offset (e.g., the distance between a top surface of GATE1 and GATE 2 from the top surface of the semiconductor heterostructure) may be determined by testing samples of devices. The devices may be tested for both an improvement in terms of the mobility and the density of the electrons within the horizontally-confined electrostatic channel. Mobility may relate to how far the electrons travel within the channel before they get scattered or are otherwise impacted. The amount of the offset, as represented in this example by the distance D, may be optimized by testing several batches of samples having different amounts of the offset. Alternatively, or additionally, the device behavior, including the channel characteristics, may be simulated to determine the appropriate amount of the offset.

With continued reference to FIG. 6, an application of different amounts of voltage to the gates (e.g., GATE1 and GATE2) located on each side of the horizontally-confined channel may allow one to change a size of the stopgap defined by the geometrical shape of the nanowire. In this example, GATE1 may correspond to gate 142 of FIG. 5 and GATE2 may correspond to gate 144 of FIG. 5. The voltages applied to the gates (e.g., via terminals T1 and T2) create an electric field that can move the electrons in the horizontally-confined channel. In one example, assuming the voltages applied to the gates create 2 volts of voltage difference, then the nanowire (shown as dotted lines in view 620) may be a 100 nm wide nanowire. In another example, assuming the voltages applied to the gates create 4 volts of voltage difference, then the same nanowire may be 50 nm wide nanowire. In sum, the application of appropriate voltages via the gates (e.g., GATE1 an GATE2) may allow modulation of the width of the nanowire formed as part of semiconductor-superconductor hybrid device 10 of FIG. 5. In addition, as described earlier, the damage to the semiconductor during the formation of such devices results in increased line edge roughness (LER) of the superconductor, which in turn decreases the size of the topological gap. Tunability may allow for more relaxed process constraints during fabrication of the semiconductor-superconductor hybrid devices described herein.

Still referring to FIG. 6, the tunability afforded by the gates located on each side of the horizontally-confined electrostatic channel of semiconductor-superconductor hybrid device 10 may create additional advantages. As an example, the size of the topological gap associated with semiconductor-superconductor hybrid device 10 is a function of many process and material related aspects. As a result, the single subband regime may vary from device to device depending upon the materials and the process used to manufacture the device. Tunability of the horizontally-confined electrostatic channel, however, may allow for fine tuning of the channel even in a single subband regime to achieve the required topological gap. Another potential advantage may be associated with the ability to use the same set of materials and processes for multiple-window stacks and other more complicated arrangements of nanowires. This is because by the application of the appropriate voltages to the gates associated with the respective horizontally-confined electrostatic channels, one could tune the respective nanowires for the required subband regime. In addition, such tunability may be particularly helpful when the energy separation between the subbands is very low in a multiple subband regime.

Appropriate voltages for the gates may be coupled to the gates through a power supply grid formed as part of the same integrated circuit as semiconductor-superconductor hybrid device 10. The power supply grid may be coupled through vias or other interconnect structures formed as part of the integrated circuit. The voltages themselves may be generated using voltage regulators included as part of a controller associated with the integrated circuit. Such a controller may be separate from, or integrated with, the integrated circuit that includes multiple instances of the semiconductor-superconductor hybrid devices functioning as nanowires or other types of topological quantum computing devices.

Figure 7:
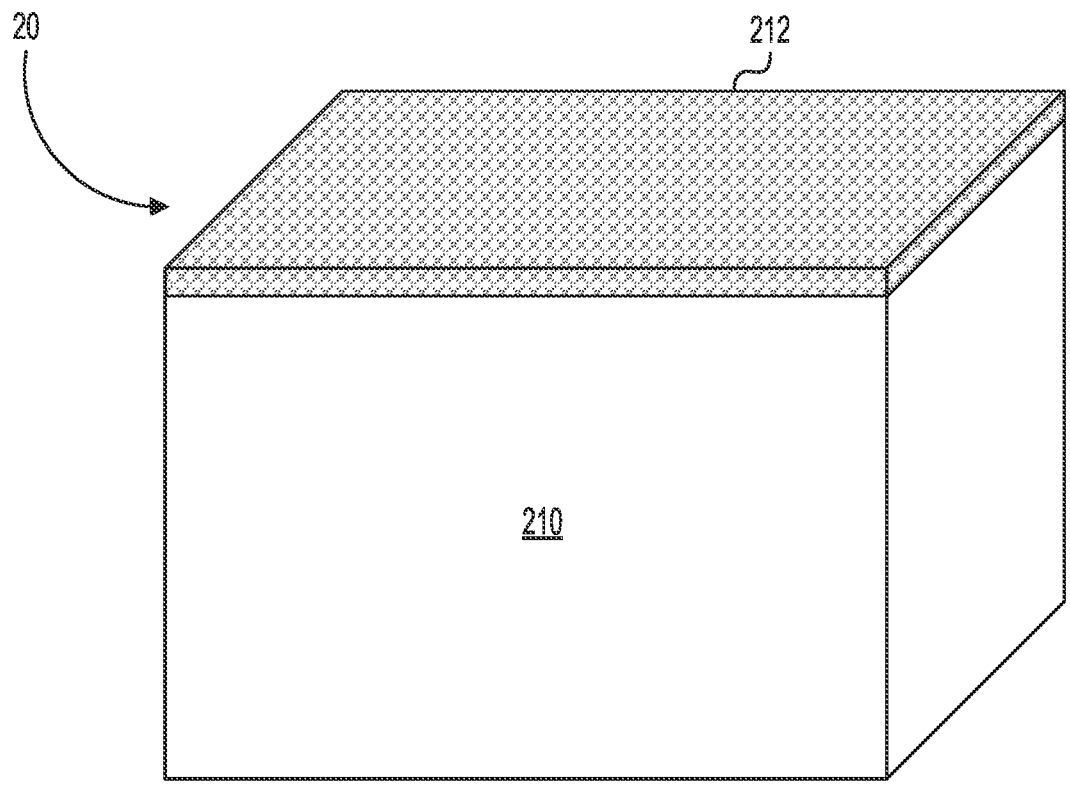
FIG. 7 shows a view of another example semiconductor-superconductor hybrid device at a stage in processing.

FIG. 7 shows a view 700 of another example semiconductor-superconductor hybrid device 20 at a stage in processing. Semiconductor-superconductor hybrid device 20 may include a semiconductor heterostructure wafer 210 capped with a capping layer 212. Semiconductor heterostructure wafer 210 may be formed using materials discussed earlier in a similar fashion as described earlier with respect to FIG. 1. Capping layer 212 may be formed on semiconductor heterostructure wafer 210 to protect the semiconductor heterostructure's top surface from oxidation or other processing induced changes. Such a capping layer may be a gallium arsenide layer or an aluminum arsenide layer. Other materials that may help protect the 2-DEG may include materials such as aluminum oxide, niobium, or other suitable materials. In addition, semiconductor-superconductor hybrid device 20 may include additional or fewer intervening layers other than those shown in FIG. 7.

Figure 8:
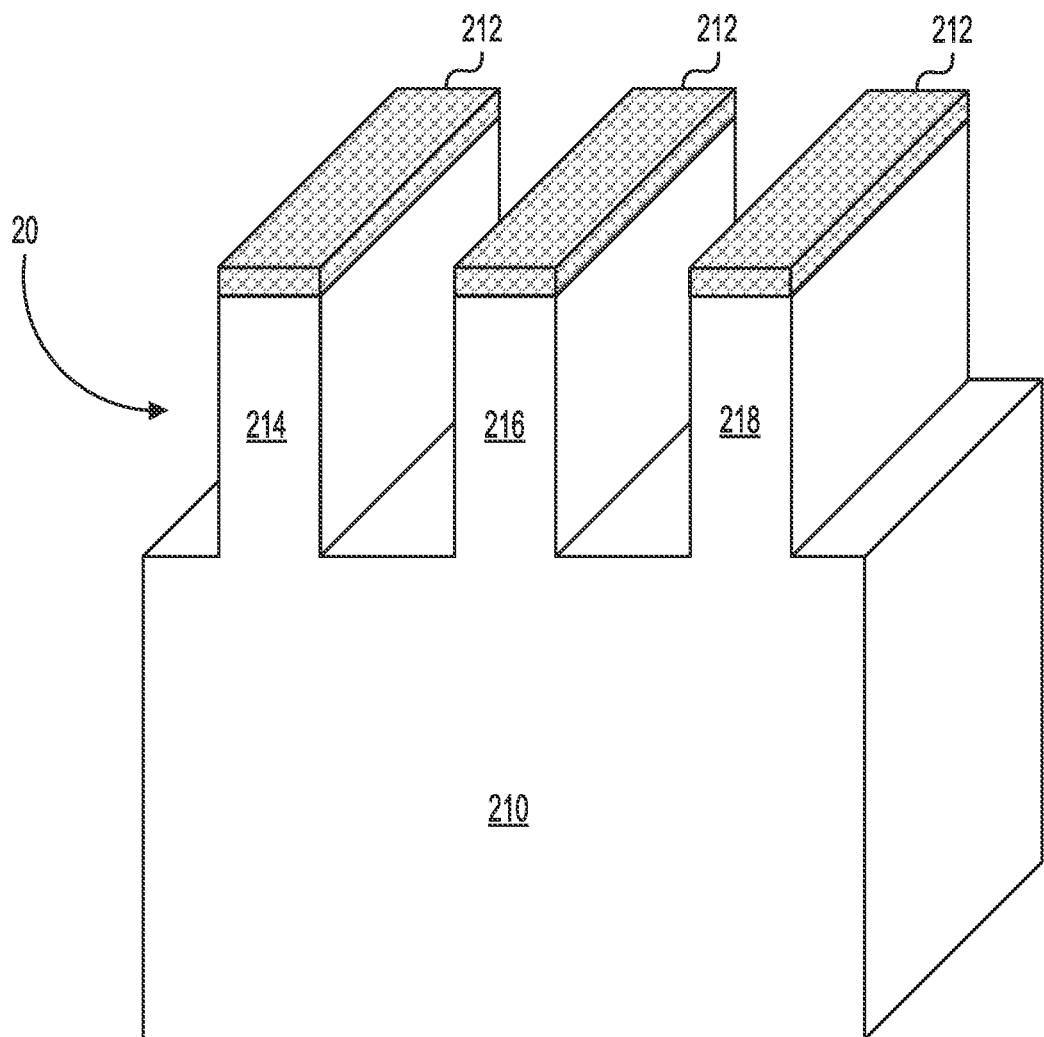
FIG. 8 shows a view of the example semiconductor-superconductor hybrid device of FIG. 7 at a subsequent stage in processing.

FIG. 8 shows a view 800 of the example semiconductor-superconductor hybrid device 20 of FIG. 7 at a subsequent stage in processing. This state of processing corresponds to the patterning of semiconductor heterostructure wafer 210. Lithographic techniques may be used to form masks with the desired patterns, which could then be transferred using isotropic etching (or other types of techniques for removing material to form structures) to semiconductor heterostructure wafer 210. In this example, the isotropic etching step may result in the formation of isolated semiconductor heterostructures 214, 216, and 218 with the capping layer 212 now remaining over only the isolated semiconductor heterostructures formed as part of this step. Each isolated semiconductor heterostructure may have a certain aspect ratio similar to as described earlier with respect to FIG. 4. In one example the aspect ratio can be less than 1 or greater than 1. Process node size and associated technical constraints may determine the aspect ratio. In this example, the purpose of exposing the sides is to allow the formation of a gate on each side of isolated semiconductor heterostructures 214, 216, and 218. Moreover, the separation between each of isolated semiconductor heterostructures 214, 216, and 218 may be selected to ensure functional and electrical isolation with respect to the operation of these structures. Although FIG. 8 shows a certain number of layers of semiconductor-superconductor hybrid device 20 arranged in a certain manner, there could be more or fewer numbers of layers arranged differently.

Figure 9:
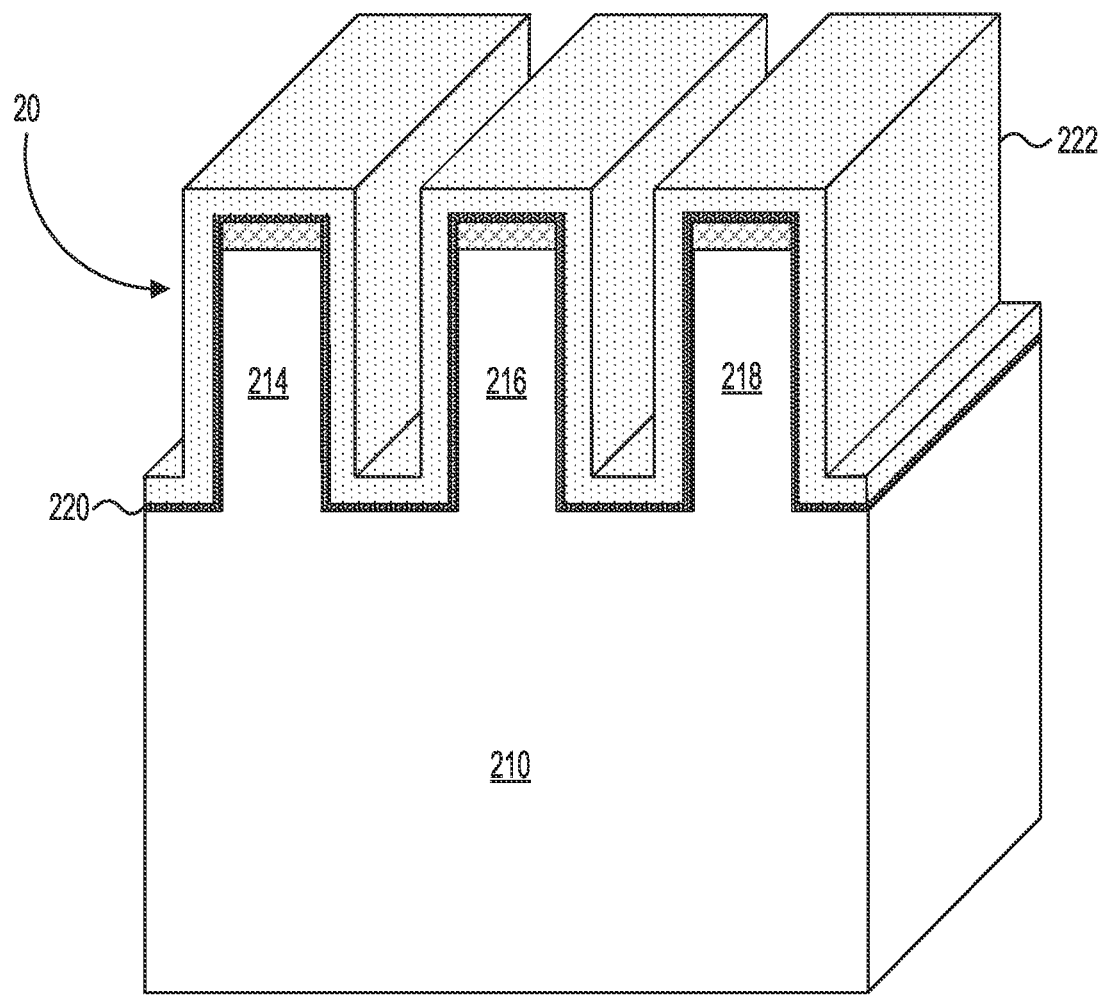
FIG. 9 shows a view of the example semiconductor-superconductor hybrid device of FIG. 8 at a subsequent stage in processing.

FIG. 9 shows a view 900 of the example semiconductor-superconductor hybrid device 20 of FIG. 8 at a subsequent stage in processing. At this stage of the processing, a dielectric layer 220 may be conformally deposited on top of isolated semiconductor heterostructures 214, 216, and 218. Subsequently, a metal layer 222 may be formed on top of dielectric layer 220. Dielectric layer 220 may be deposited (or otherwise formed) conformally using techniques such as atomic layer deposition. Materials used to form dielectric layer 220 may include oxides (e.g., aluminum oxide or hafnium oxide) or nitrides. In addition, spin-on dielectrics, such as polyimides, may also be used to form dielectric layer 220. Example organic-based dielectric layer materials may include hydrogen silsesquioxane (HSQ), benzocyclobutene (BCB), or the like. Such materials may need curing and additional processing. In one example, dielectric layer 220 may have a thickness in a range between 5 nm to 10 nm.

With continued reference to FIG. 9, metal layer 222 may be formed using atomic layer deposition. Metal layer 222 may comprise aluminum, cobalt, or another suitable metal for use as a gate electrode. Although FIG. 9 shows a certain number of layers of semiconductor-superconductor hybrid device 20 arranged in a certain manner, there could be more or fewer numbers of layers arranged differently.

Figure 10:
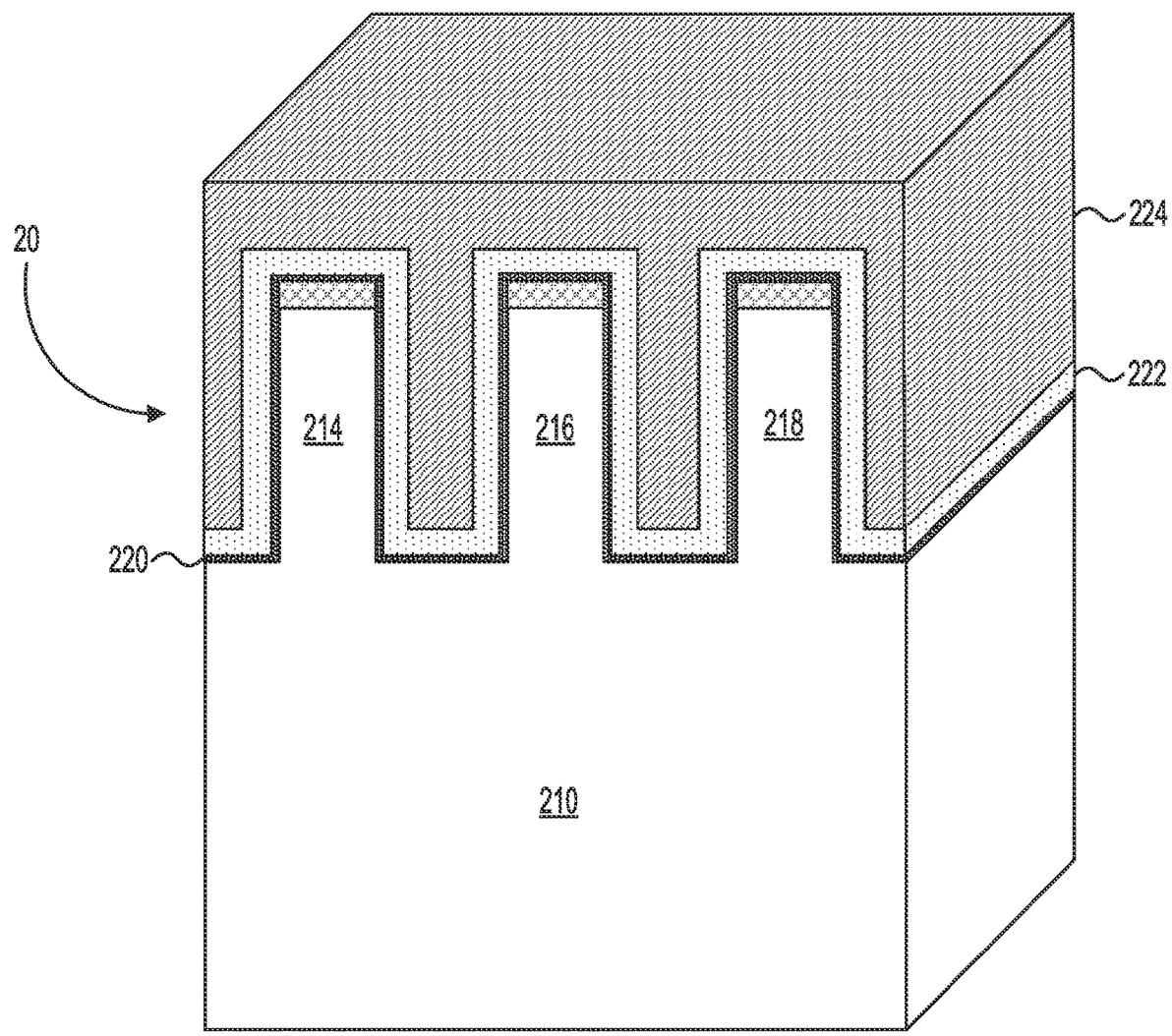
FIG. 10 shows a view of the example semiconductor-superconductor hybrid device of FIG. 9 at a subsequent stage in processing.

FIG. 10 shows a view 1000 of the example semiconductor-superconductor hybrid device 20 of FIG. 9 at a subsequent stage in processing. As part of this step a dielectric material may be used to accomplish a fill 224. Any dielectric material that allows for a conformal deposition (e.g., suitable oxides or nitrides) may be used to create fill 224. Alternatively, dielectrics such as polyimides may also be used. Although FIG. 10 shows a certain number of layers of semiconductor-superconductor hybrid device 20 arranged in a certain manner, there could be more or fewer numbers of layers arranged differently.

Figure 11:
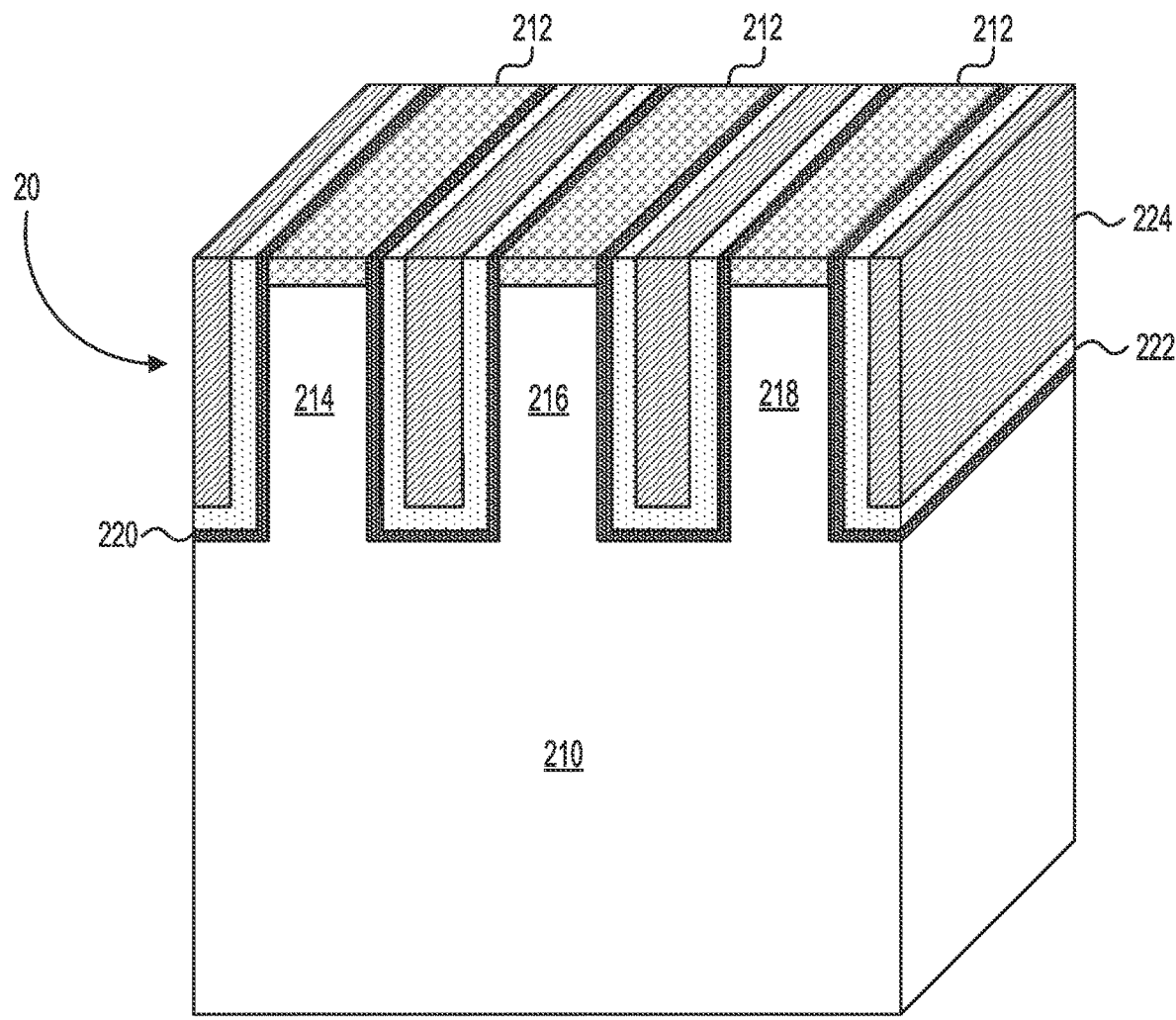
FIG. 11 shows a view of the example semiconductor-superconductor hybrid device of FIG. 10 at a subsequent stage in processing.

FIG. 11 shows a view 1100 of the example semiconductor-superconductor hybrid device 20 of FIG. 10 at a subsequent stage in processing. At this stage of the processing, fill 224 associated with semiconductor-superconductor hybrid device 20 may be planarized. Any of chemical polishing, mechanical polishing, or chemical-mechanical polishing (CMP) may be used as part of this step. The polishing step may be used to remove enough material to expose capping layer 212 described earlier.

Figure 12:
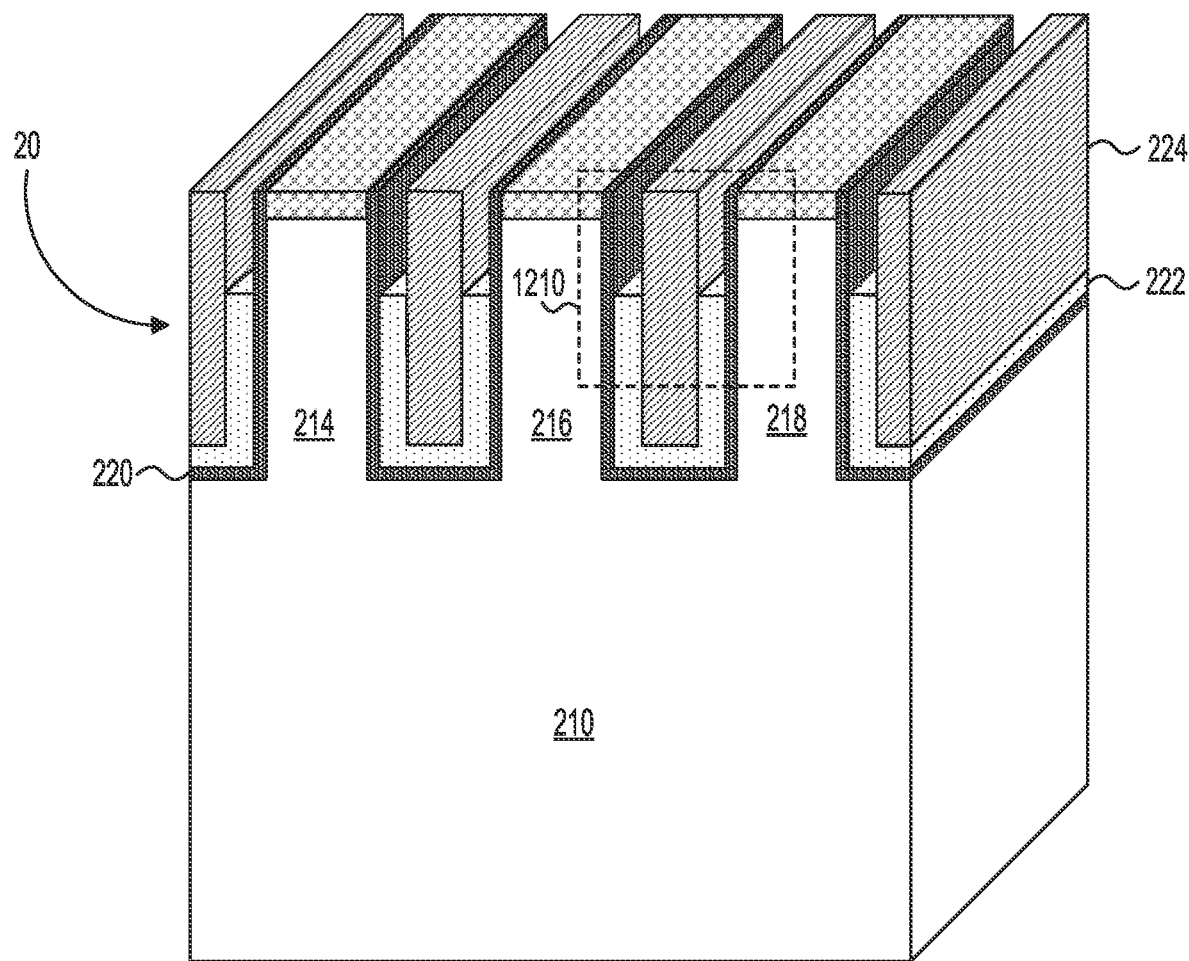
FIG. 12 shows a view of the example semiconductor-superconductor hybrid device of FIG. 11 at a subsequent stage in processing
Figure 13:
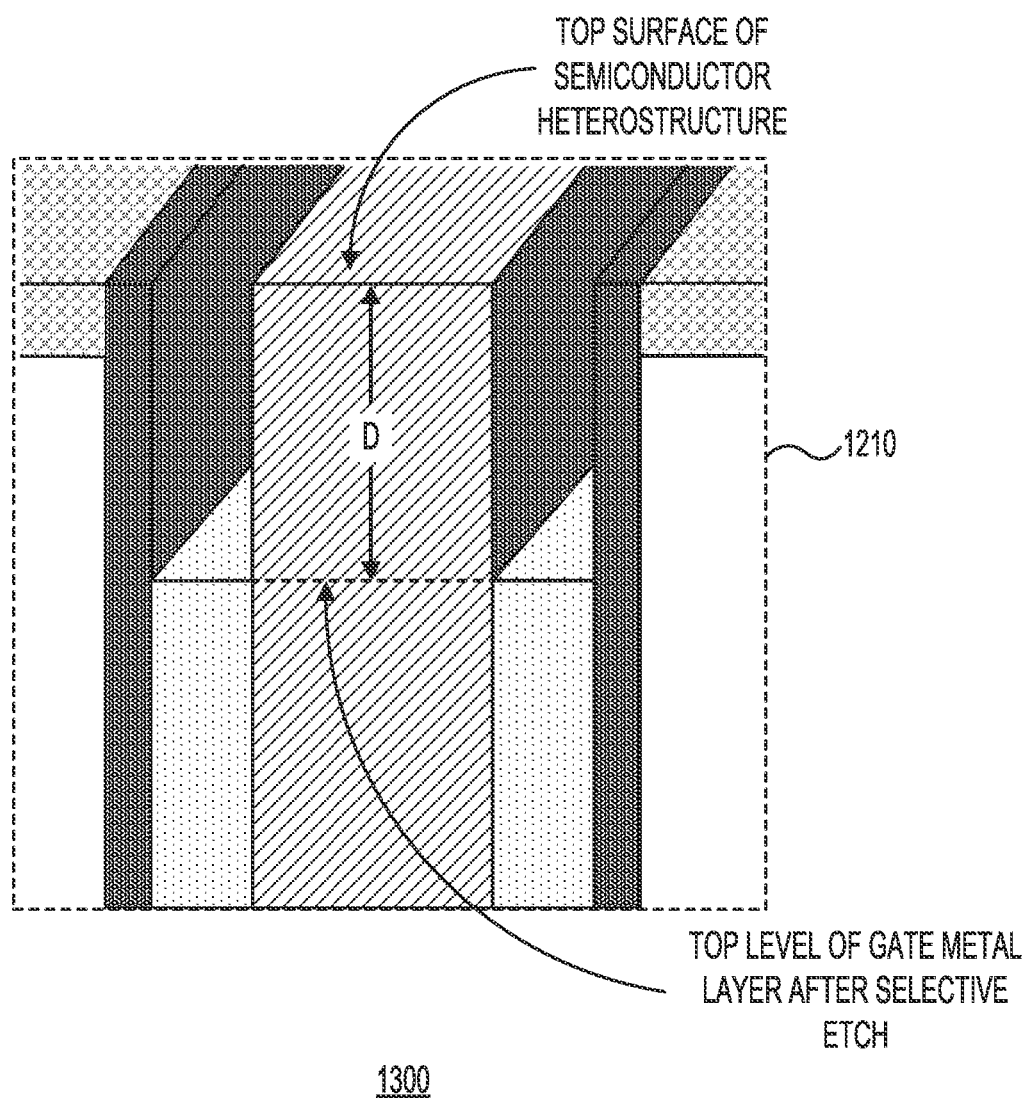
FIG. 13 shows an expanded view of a portion of the example semiconductor-superconductor hybrid device of FIG. 12.

FIG. 12 shows a view 1200 of the example semiconductor-superconductor hybrid device 20 of FIG. 11 at a subsequent stage in processing. At this stage of processing, a portion of metal layer 222 may be selectively etched to remove a portion of metal layer 222 along a side of each of isolated semiconductor heterostructures 214, 216, and 218. Any etch chemistry that is selective to the metal used to form metal layer 222 may be used as part of this step. As an example, assuming metal layer 222 is formed using aluminum, then Transene Etchant Type D etch chemistry may be used. As another example, assuming metal layer 222 is formed using cobalt, then citric acid or a similar etch chemistry may be used. Additional details concerning this step are provided by showing a portion 1210 of view 1200 as an expanded view 1300 in FIG. 13. As shown in FIG. 13, the removal of a portion of metal layer 222 results in the top surface of each gate to be the same as the surface labeled as the TOP LEVEL OF GATE METAL LAYER AFTER SELECTIVE ETCH. The letter D in FIG. 13 represents an amount of the offset between a TOP SURFACE OF SEMICONDUCTOR HETEROSTRUCTURE and the top surface of each of the left gate and the right gate. Although FIG. 12 shows a certain number of layers of semiconductor-superconductor hybrid device 20 arranged in a certain manner, there could be more or fewer numbers of layers arranged differently.

Figure 14:
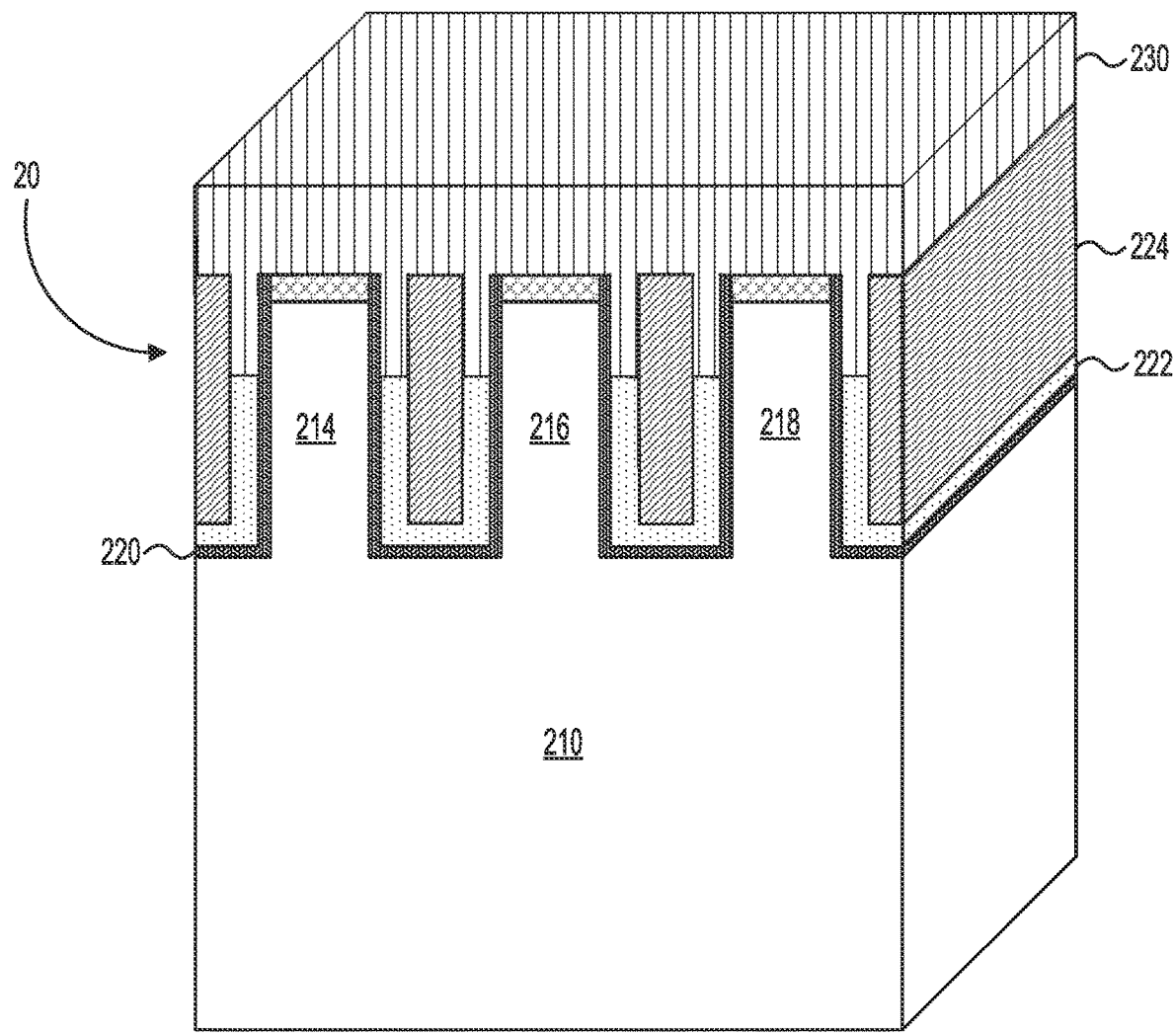
FIG. 14 shows a view of the example semiconductor-superconductor hybrid device of FIG. 12 at a subsequent stage in processing.

FIG. 14 shows a view 1400 of the example semiconductor-superconductor hybrid device 20 of FIG. 12 at a subsequent stage in processing. As part of this step a dielectric material may be used to accomplish a fill 230. The purpose of this step is to ensure that the grooves created by the selective etch of metal layer 222 are properly filled with no keyholes or other types of air pockets. Any dielectric material that allows for a conformal deposition (e.g., suitable oxides or nitrides) may be used to create fill 230. Alternatively, dielectrics such as polyimides may also be used. Although FIG. 14 shows a certain number of layers of semiconductor-superconductor hybrid device 20 arranged in a certain manner, there could be more or fewer numbers of layers arranged differently.

Figure 15:
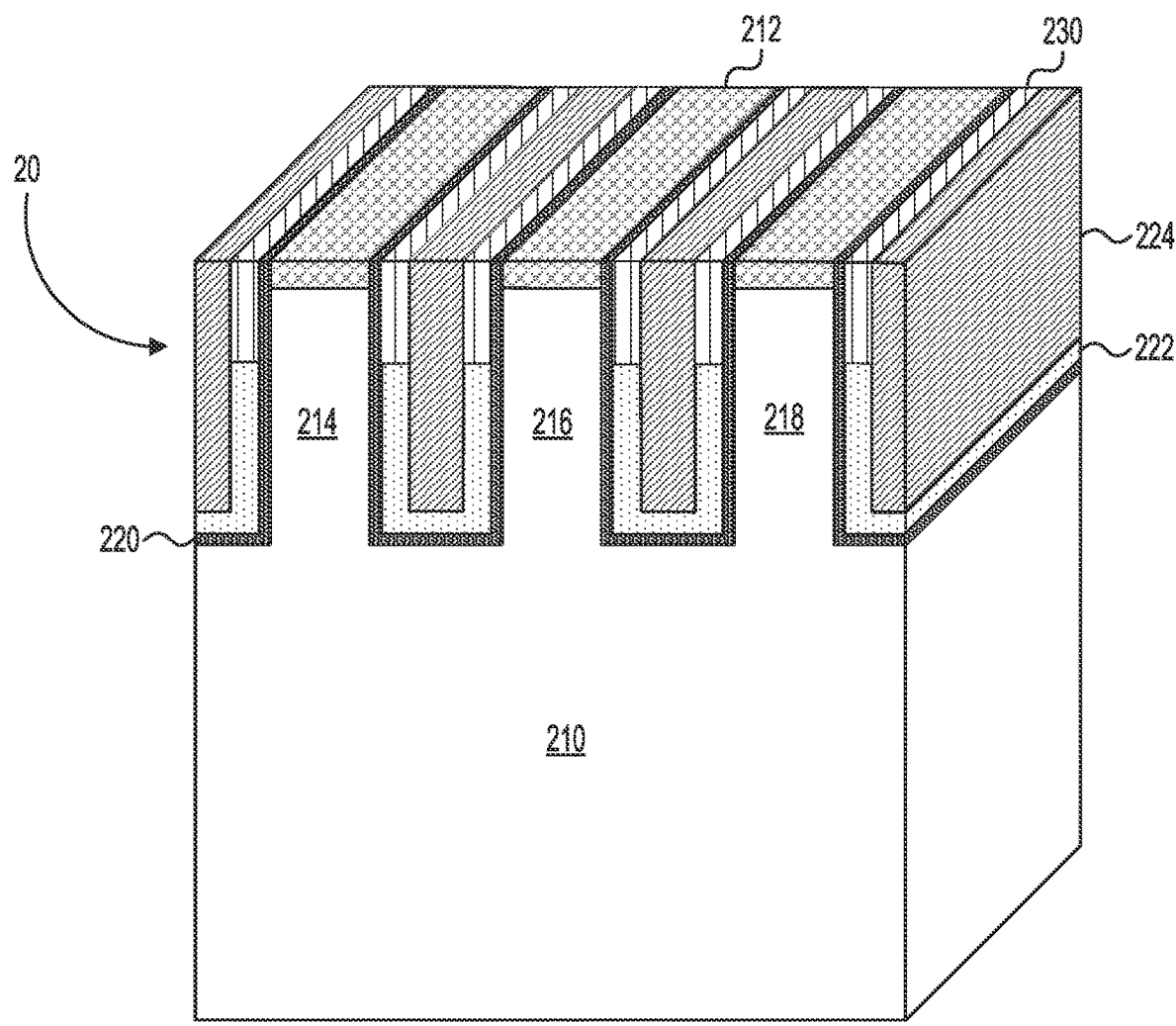
FIG. 15 shows a view of the example semiconductor-superconductor hybrid device of FIG. 14 at a subsequent stage in processing.

FIG. 15 shows a view 1500 of the example semiconductor-superconductor hybrid device 20 of FIG. 14 at a subsequent stage in processing. At this stage of the processing, fill 230 associated with semiconductor-superconductor hybrid device 20 may be planarized. Any of chemical polishing, mechanical polishing, or chemical-mechanical polishing (CMP) may be used as part of this step. The polishing step may be used to remove enough material to expose capping layer 212, described earlier.

Figure 16:
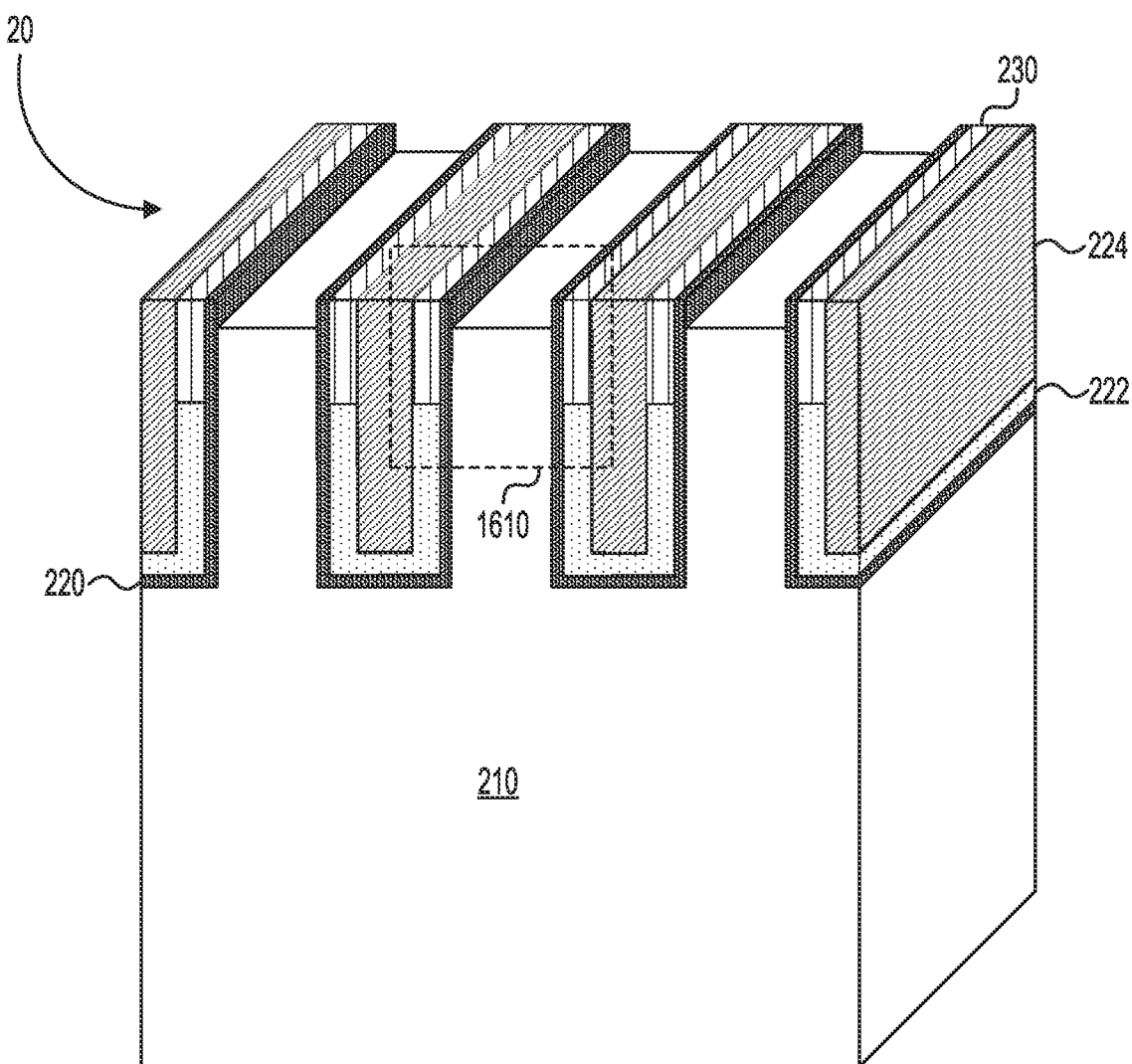
FIG. 16 shows a view of the example semiconductor-superconductor hybrid device of FIG. 15 at a subsequent stage in processing.
Figure 17:
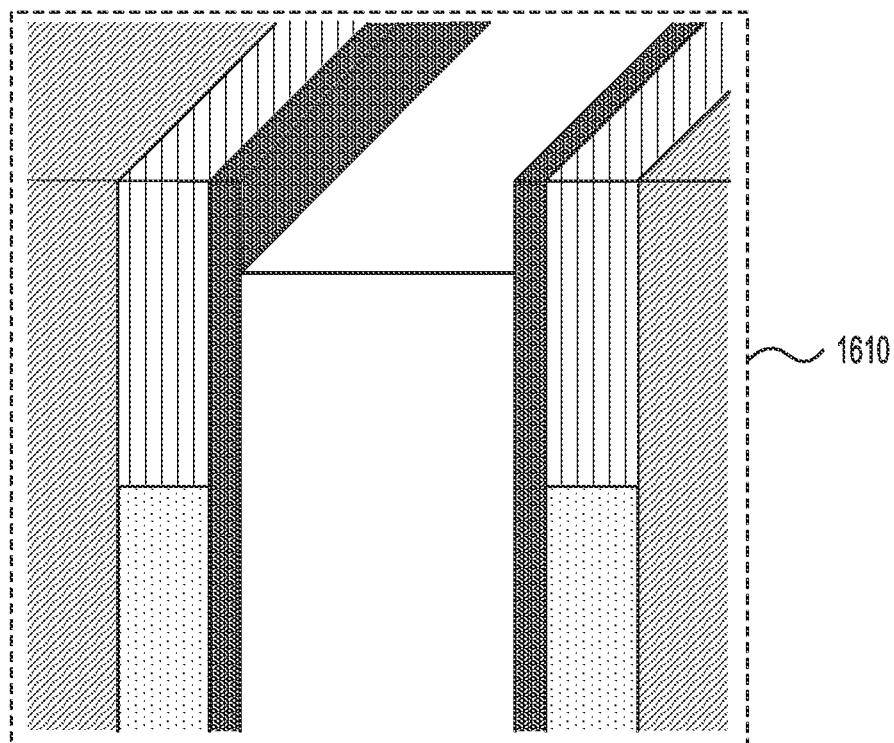
FIG. 17 shows an expanded view of a portion of the example semiconductor-superconductor hybrid device of FIG. 16.

FIG. 16 shows a view 1600 of the example semiconductor-superconductor hybrid device 20 of FIG. 15 at a subsequent stage in processing. At this stage, capping layer 212 may be selectively removed without causing a removal of the other materials at or near the top surface of semiconductor-superconductor hybrid device 20. Assuming capping layer 212 is an arsenide cap, then thermal desorption (e.g., temperature range between 300 degrees Centigrade to 375 degrees Centigrade) may be used to effect arsenic desorption of capping layer 212. Indeed, if materials other than arsenic is used for capping layer 212, then appropriate thermal or other techniques may be used to selectively remove capping layer 212. FIG. 17 shows an expanded view of a portion 1610 of the example semiconductor-superconductor hybrid 20 device of FIG. 16.

Figure 18:
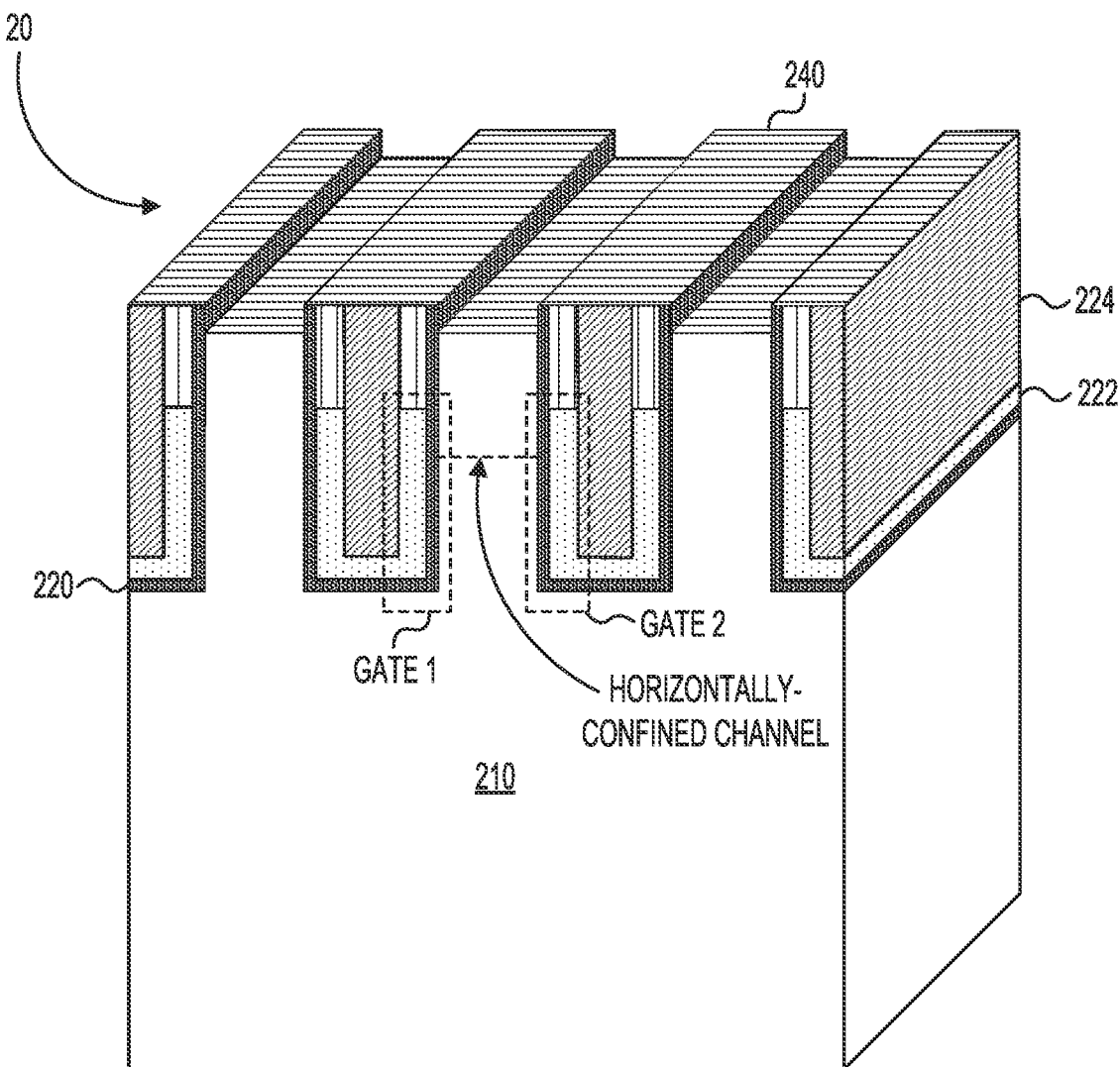
FIG. 18 shows a view of the example semiconductor-superconductor hybrid device of FIG. 16 at a subsequent stage in processing.

FIG. 18 shows a view 1800 of the example semiconductor-superconductor hybrid device 20 of FIG. 16 at a subsequent stage in processing. At this stage of the processing, a superconducting metal layer 240 may be formed over a top surface of semiconductor-superconductor hybrid device 20 of FIG. 16. Any superconductors that demonstrate periodicity for electronic pairing related to the existence of Cooper pairs may be used to form superconducting metal layer 240. Example materials that could be used to form superconducting metal layer 240 include, but are not limited to, lead, indium, tin, and aluminum. Although FIG. 18 shows a certain number of layers of semiconductor-superconductor hybrid device 20 arranged in a certain manner, there could be more or fewer numbers of layers arranged differently.

In terms of the operation of semiconductor-superconductor hybrid device 20, similar to as explained earlier with respect to FIG. 6, an application of different amounts of voltage to the gates located on each side of the horizontally-confined channel may allow one to change a size of the stopgap defined by the geometrical shape of the nanowire. The voltages applied to the gates (e.g., to gates GATE1 and GATE2 shown in FIG. 18) create an electric field that can move the electrons in the horizontally-confined channel (e.g., identified as a dotted line HORIZONTALLY-CONFINED CHANNEL in FIG. 18). As explained earlier, the application of appropriate voltages via the gates (e.g., GATE1 an GATE2) may allow modulation of the width of the nanowire formed as part of semiconductor-superconductor hybrid device 20 of FIG. 18. In addition, as described earlier, the damage to the semiconductor during the formation of such devices results in increased line edge roughness (LER) of the superconductor which in turn decreases the size of the topological gap. For similar reasons as discussed earlier, the tunability of the size of the topological gap may allow for more relaxed process constraints during fabrication of the semiconductor-superconductor hybrid devices described herein.

In addition, as described earlier with respect to FIG. 6, the tunability afforded by the gates (e.g., GATE1 and GATE2) located on each side of the horizontally-confined electrostatic channel of semiconductor-superconductor hybrid device 20 may create additional advantages. As an example, the size of the topological gap associated with semiconductor-superconductor hybrid device 20 is a function of many process and material related aspects. As a result, the single subband regime may vary from device to device depending upon the materials and the process used to manufacture the device. Tunability of the horizontally-confined electrostatic channel, however, may allow for fine tuning of the channel even in a single subband regime to achieve the required topological gap. Another potential advantage may be associated with the ability to use the same set of materials and processes for multiple-window stacks and other more complicated arrangements of nanowires. This is because by the application of the appropriate voltages to the gates associated with the respective horizontally-confined electrostatic channels, one could tune the respective nanowires for the required subband regime. In addition, such tunability may be particularly helpful when the energy separation between the subbands is very low in a multiple subband regime.

As described earlier, appropriate voltages for the gates may be coupled to the gates through a power supply grid formed as part of the same integrated circuit as semiconductor-superconductor hybrid device 20. The power supply grid may be coupled through vias or other interconnect structures formed as part of the integrated circuit. The voltages themselves may be generated using voltage regulators included as part of a controller associated with the integrated circuit. Such a controller may be separate from, or integrated with, the integrated circuit that includes multiple instances of the semiconductor-superconductor hybrid devices functioning as nanowires or other types of topological quantum computing devices. In addition, as described earlier, these techniques are not only applicable to InAs 2-DEGs, but also to VLS wires, SAG materials, or any other devices made from any semiconductor materials selected from group III-V of the periodic table or the like. Although the semiconductor-superconductor hybrid devices are described as formed using materials that have conduction band and valence band offsets to collect electrons, such devices may be formed using a different set of materials and be arranged differently, to collect holes. As an example, the semiconductor-superconductor hybrid devices may include 2-dimensional hole gas (2-DHG) structures instead of 2-DEG structures.

Figure 19:
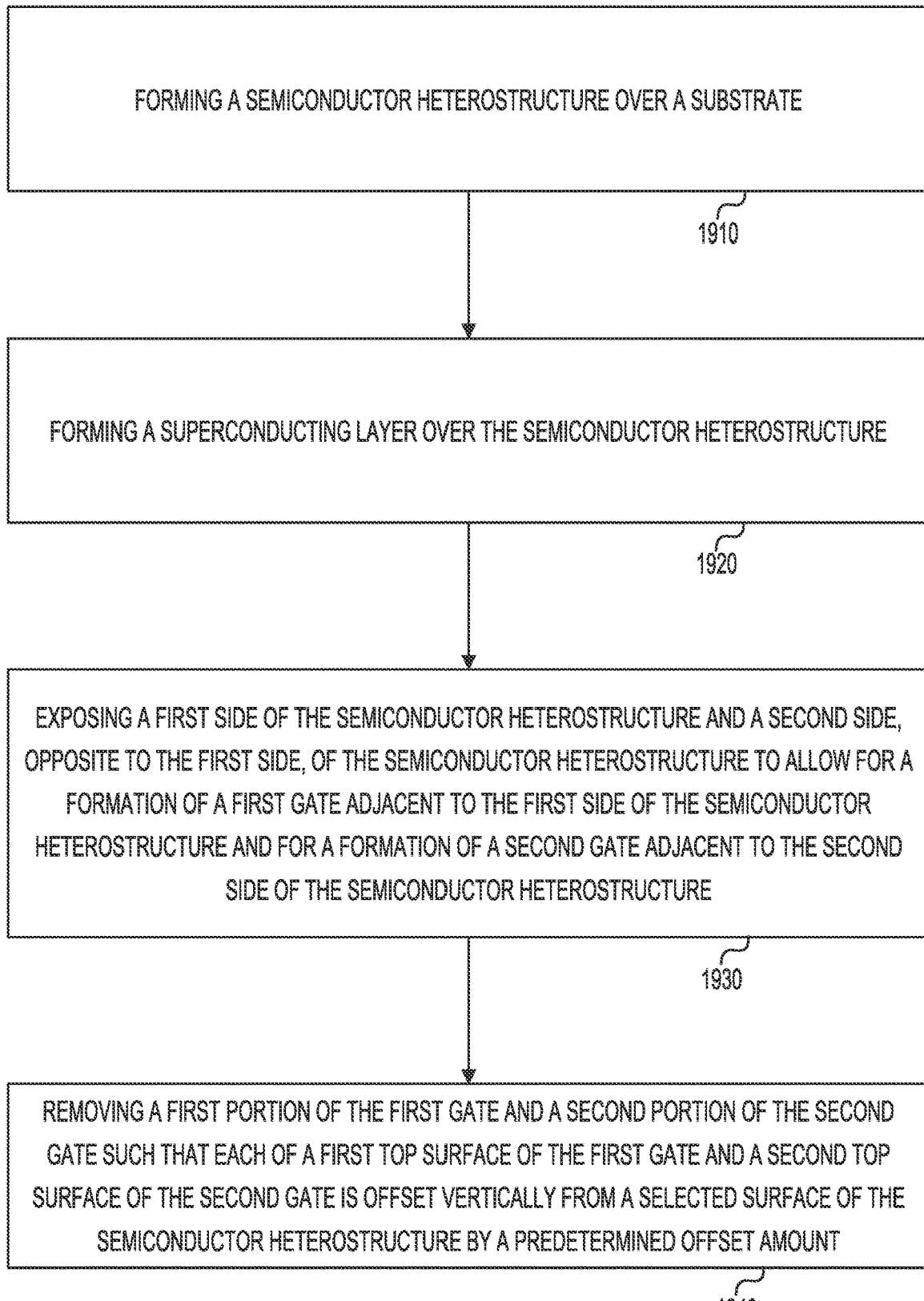
FIG. 19 shows a flowchart of a method for forming a semiconductor-superconductor hybrid device in accordance with one example.

FIG. 19 shows a flowchart 1900 of a method for forming a semiconductor-superconductor hybrid device in accordance with one example. Step 1910 may include forming a semiconductor heterostructure over a substrate. In one example, this step may include the formation of the layers described with respect to FIG. 1. In addition, the semiconductor heterostructure may include a capping layer, as well. As explained earlier, the semiconductor heterostructure may include a first layer of indium arsenide or aluminum arsenide, a second layer of indium arsenide, and a third layer of indium arsenide or gallium arsenide. Moreover, other combinations of materials may also be used. The substrate may comprise one of indium phosphide, indium arsenide, indium antimonide, or indium arsenide antimonide.

Step 1920 may include forming a superconducting layer over the semiconductor heterostructure. In one example, this step may include the process described earlier with respect to FIG. 2. As explained earlier, the superconducting layer may comprise one of lead, indium, tin, or aluminum.

Step 1930 may include exposing a first side of the semiconductor heterostructure and a second side, opposite to the first side, of the semiconductor heterostructure to allow for a formation of a first gate adjacent to the first side of the semiconductor heterostructure and for a formation of a second gate adjacent to the second side of the semiconductor heterostructure. As described earlier with respect to FIG. 4, this step may be performed by selectively removing (e.g., via etching) certain materials to expose the sides. In this example, the selective removal of these materials results in the formation of a semiconductor-superconductor hybrid structure with a certain aspect ratio defined by a ratio of its width (B) to depth (A).

Step 1940 may include removing a first portion of the first gate and a second portion of the second gate such that each of a first top surface of the first gate and a second top surface of the second gate is offset vertically from a selected surface of the semiconductor heterostructure by a predetermined offset amount. As explained with respect to FIGS. 5 and 6, the formation of gates may include selectively removing a gate metal layer (or other gate-related materials) to ensure that any horizontally-confined channel is formed at a certain distance away from any structural disorder at or near the top surface of the semiconductor heterostructure. In one example, the selected surface may be the top surface of the semiconductor heterostructure.

FIG. 20 shows another flowchart 2000 of a method for forming a semiconductor-superconductor hybrid device in accordance with one example. Step 2010 may include forming a first isolated semiconductor heterostructure and a second isolated semiconductor heterostructure over a substrate. As described earlier, with respect to FIGS. 7 and 8, lithographic techniques may be used to form masks with the desired patterns, which could then be transferred using isotropic etching (or other types of techniques for removing material to form structures) to semiconductor heterostructure wafer 210 of FIG. 8. As explained earlier, the isotropic etching step may result in the formation of isolated semiconductor heterostructures (e.g., isolated semiconductor heterostructures 214, 216, and 218 with the capping layer 212).

Step 2020 may include forming a left gate adjacent to a first side of each of the first isolated semiconductor heterostructure and the second isolated semiconductor heterostructure. Additional details with respect to one way of forming the left gate are described with respect to FIG. 9.

Step 2030 may include forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. Additional details with respect to one way of forming the left gate are described with respect to FIG. 9. Indeed, both the left and the right gate may be formed using process steps that are performed simultaneously. As explained earlier with respect to FIGS. 12 and 13, a portion of metal layer 222 (associated with each of the left gate and the right gate) may be selectively etched to remove a portion of metal layer 222 along a side of each of isolated semiconductor heterostructures 214, 216, and 218 described earlier.

Step 2040 may include forming a superconducting layer over each of the first isolated semiconductor heterostructure and the second isolated semiconductor heterostructure. In one example, this step may be performed as described with respect to FIG. 18 earlier.

In conclusion, the present disclosure relates to a method for forming a semiconductor-superconductor hybrid device including forming a first isolated semiconductor heterostructure and a second isolated semiconductor heterostructure over a substrate. The method may further include forming a left gate adjacent to a first side of each of the first isolated semiconductor heterostructure and the second isolated semiconductor heterostructure. The method may further include forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. The method may further include forming a superconducting layer over each of the first isolated semiconductor heterostructure and the second isolated semiconductor heterostructure.

As part of the method, forming the first isolated semiconductor heterostructure and the second isolated semiconductor heterostructure may include etching a semiconductor heterostructure wafer having a capping layer. The method may further include removing the capping layer prior to forming the superconducting layer over each of the first isolated semiconductor heterostructure and the second isolated semiconductor heterostructure.

The forming the left gate adjacent to the first side of each of the first isolated semiconductor heterostructure and the second isolated semiconductor heterostructure and forming the right gate adjacent to the second side of each of the first isolated semiconductor heterostructure and the second isolated semiconductor heterostructure may include: (1) forming a dielectric layer over each of the first isolated semiconductor heterostructure and the second isolated semiconductor heterostructure, (2) forming a metal layer over the dielectric layer, and (3) selectively removing the metal layer such that each of the left gate and the right gate is offset vertically from the selected surface of each of the first isolated semiconductor heterostructure and the second isolated semiconductor heterostructure by the predetermined offset amount.

Each of the first isolated semiconductor heterostructure and the second isolated semiconductor heterostructure may comprise: (1) a first layer of indium arsenide or aluminum arsenide, a second layer of indium arsenide, and a third layer of indium arsenide or gallium arsenide, or (2) a first layer of gallium arsenide or indium arsenide, a second layer of mercury telluride, cadmium telluride, or cadmium selenide, and a third layer of cadmium zinc telluride. The superconducting layer may comprise one of lead, indium, tin, or aluminum. The substrate may comprise one of indium phosphide, indium arsenide, indium antimonide, or indium arsenide antimonide.

In another aspect, the present disclosure relates to a method for forming a semiconductor-superconductor hybrid device including forming a first isolated semiconductor heterostructure and a second isolated semiconductor heterostructure over a substrate. The method may further include forming a left gate adjacent to a first side of each of the first isolated semiconductor heterostructure and the second isolated semiconductor heterostructure and forming a right gate adjacent to a second side, opposite to the first side, of each of the first isolated semiconductor heterostructure and the second isolated semiconductor heterostructure, where a top surface of each of the left gate and the right gate is offset vertically from a selected surface of each of the first isolated semiconductor heterostructure and the second isolated semiconductor heterostructure by a predetermined offset amount. The method may further include forming a superconducting layer over each of the first isolated semiconductor heterostructure and the second isolated semiconductor heterostructure, where the semiconductor-superconductor hybrid device is configured to form a horizontally-confined electrostatic channel responsive to an application of an electric field via a respective left gate and a right gate associated with a respective isolated semiconductor heterostructure.

As part of the method, forming the first isolated semiconductor heterostructure and the second isolated semiconductor heterostructure may include etching a semiconductor heterostructure wafer having a capping layer. The method may further include removing the capping layer prior to forming the superconducting layer over each of the first isolated semiconductor heterostructure and the second isolated semiconductor heterostructure.

The forming the left gate adjacent to the first side of each of the first isolated semiconductor heterostructure and the second isolated semiconductor heterostructure and forming the right gate adjacent to the second side of each of the first isolated semiconductor heterostructure and the second isolated semiconductor heterostructure may include: (1) forming a dielectric layer over each of the first isolated semiconductor heterostructure and the second isolated semiconductor heterostructure, (2) forming a metal layer over the dielectric layer, and (3) selectively removing the metal layer such that each of the left gate and the right gate is offset vertically from the selected surface of each of the first isolated semiconductor heterostructure and the second isolated semiconductor heterostructure by the predetermined offset amount.

Each of the first isolated semiconductor heterostructure and the second isolated semiconductor heterostructure may comprise: (1) a first layer of indium arsenide or aluminum arsenide, a second layer of indium arsenide, and a third layer of indium arsenide or gallium arsenide, or (2) a first layer of gallium arsenide or indium arsenide, a second layer of mercury telluride, cadmium telluride, or cadmium selenide, and a third layer of cadmium zinc telluride. The superconducting layer may comprise one of lead, indium, tin, or aluminum. The substrate may comprise one of indium phosphide, indium arsenide, indium antimonide, or indium arsenide antimonide.

In yet another aspect, the present disclosure relates to a method for forming a semiconductor-superconductor hybrid device including forming a semiconductor heterostructure over a substrate. The method may further include forming a superconducting layer over the semiconductor heterostructure. The method may further include exposing a first side of the semiconductor heterostructure and a second side, opposite to the first side, of the semiconductor heterostructure to allow for a formation of a first gate adjacent to the first side of the semiconductor heterostructure and for a formation of a second gate adjacent to the second side of the semiconductor heterostructure. The method may further include removing a first portion of the first gate and a second portion of the second gate such that each of a first top surface of the first gate and a second top surface of the second gate is offset vertically from a selected surface of the semiconductor heterostructure by a predetermined offset amount.

The semiconductor-superconductor hybrid device may be configured to form a horizontally-confined electrostatic channel in the semiconductor heterostructure in response to an application of an electric field to the semiconductor heterostructure via the first gate and the second gate. The predetermined offset amount may be selected to ensure that the horizontally-confined electrostatic channel is formed at a selected distance from the selected surface of the semiconductor heterostructure to reduce an effect of any structural disorder associated with an interface of the superconducting layer with the semiconductor heterostructure. The structural disorder associated with the interface may comprise line edge roughness (LER) associated with the superconducting layer.

The horizontally-confined electrostatic channel may comprise one of a 2-dimensional electron gas (2-DEG) channel or a 2-dimensional hole gas (2-DHG) channel. The method may further include forming a first terminal coupled to the first gate and forming a second terminal coupled to the second gate, to allow for an application of a first voltage to the first terminal and a second voltage to the second terminal.

It is to be understood that the methods, modules, and components depicted herein are merely exemplary. For example, and without limitation, illustrative types of devices may include semiconductor-superconductor hybrid devices, topological nanowires, and other topological quantum computing devices, etc. Although the formation of the devices has been described with respect to specific conductivity types or polarity of potentials, skilled artisans appreciated that conductivity types and polarities of potentials may be reversed. Moreover, the terms "front," "back," "top," "bottom," "over," "under" and the like in the description and in the claims, if any, are used for descriptive purposes and not necessarily for describing the only possible relative positions. It is to be understood that the terms so used are interchangeable under appropriate circumstances such that the examples described herein are, for example, capable of operation in other orientations than those illustrated or otherwise described herein.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described layers or components included in a device are merely illustrative. The functionality of multiple layers may be combined into a single layer, and/or the functionality of a single layer may be distributed in additional layers. Moreover, alternative embodiments may include multiple instances of a particular layer, and the order of layers (e.g., from top to bottom or bottom to top) may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed:

1. A method for forming a semiconductor-superconductor hybrid device comprising:
   forming a first isolated semiconductor heterostructure and a second isolated semiconductor heterostructure over a substrate;
   forming a left gate adjacent to a first side of each of the first isolated semiconductor heterostructure and the second isolated semiconductor heterostructure;
   forming a right gate adjacent to a second side, opposite to the first side, of each of the first isolated semiconductor heterostructure and the second isolated semiconductor heterostructure, wherein a top surface of each of the left gate and the right gate is offset vertically from a selected surface of each of the first isolated semiconductor heterostructure and the second isolated semiconductor heterostructure by a predetermined offset amount; and
   forming a superconducting layer over each of the first isolated semiconductor heterostructure and the second isolated semiconductor heterostructure.

2. The method of claim 1, wherein forming the first isolated semiconductor heterostructure and the second isolated semiconductor heterostructure comprises etching a semiconductor heterostructure wafer having a capping layer.

3. The method of claim 2, further comprising removing the capping layer prior to forming the superconducting layer over each of the first isolated semiconductor heterostructure and the second isolated semiconductor heterostructure.

4. The method of claim 1, wherein forming the left gate adjacent to the first side of each of the first isolated semiconductor heterostructure and the second isolated semiconductor heterostructure and forming the right gate adjacent to the second side of each of the first isolated semiconductor heterostructure and the second isolated semiconductor heterostructure comprises:
   forming a dielectric layer over each of the first isolated semiconductor heterostructure and the second isolated semiconductor heterostructure;
   forming a metal layer over the dielectric layer; and
   selectively removing the metal layer such that each of the left gate and the right gate is offset vertically from the selected surface of each of the first isolated semiconductor heterostructure and the second isolated semiconductor heterostructure by the predetermined offset amount.

5. The method of claim 1, wherein each of the first isolated semiconductor heterostructure and the second isolated semiconductor heterostructure comprises: (1) a first layer of indium arsenide or aluminum arsenide, a second layer of indium arsenide, and a third layer of indium arsenide or gallium arsenide, or (2) a first layer of gallium arsenide or indium arsenide, a second layer of mercury telluride, cadmium telluride, or cadmium selenide, and a third layer of cadmium zinc telluride.

6. The method of claim 1, wherein the superconducting layer comprises one of lead, indium, tin, or aluminum.

7. The method of claim 1, wherein the substrate comprises one of indium phosphide, indium arsenide, indium antimonide, or indium arsenide antimonide.

8. A method for forming a semiconductor-superconductor hybrid device comprising:
   forming a first isolated semiconductor heterostructure and a second isolated semiconductor heterostructure over a substrate;
   forming a left gate adjacent to a first side of each of the first isolated semiconductor heterostructure and the second isolated semiconductor heterostructure and forming a right gate adjacent to a second side, opposite to the first side, of each of the first isolated semiconductor heterostructure and the second isolated semiconductor heterostructure, wherein a top surface of each of the left gate and the right gate is offset vertically from a selected surface of each of the first isolated semiconductor heterostructure and the second isolated semiconductor heterostructure by a predetermined offset amount; and
   forming a superconducting layer over each of the first isolated semiconductor heterostructure and the second isolated semiconductor heterostructure, wherein the semiconductor-superconductor hybrid device is configured to form a horizontally-confined electrostatic channel responsive to an application of an electric field via a respective left gate and a right gate associated with a respective isolated semiconductor heterostructure.

9. The method of claim 8, wherein forming the first isolated semiconductor heterostructure and the second isolated semiconductor heterostructure comprises etching a semiconductor heterostructure wafer having a capping layer.

10. The method of claim 9, further comprising removing the capping layer prior to forming the superconducting layer over each of the first isolated semiconductor heterostructure and the second isolated semiconductor heterostructure.

11. The method of claim 8, wherein forming the left gate adjacent to the first side of each of the first isolated semiconductor heterostructure and the second isolated semiconductor heterostructure and forming the right gate adjacent to the second side of each of the first isolated semiconductor heterostructure and the second isolated semiconductor heterostructure comprises:
   forming a dielectric layer over each of the first isolated semiconductor heterostructure and the second isolated semiconductor heterostructure;
   forming a metal layer over the dielectric layer; and
   selectively removing the metal layer such that each of the left gate and the right gate is offset vertically from the selected surface of each of the first isolated semiconductor heterostructure and the second isolated semiconductor heterostructure by the predetermined offset amount.

12. The method of claim 8, wherein each of the first isolated semiconductor heterostructure and the second isolated semiconductor heterostructure comprises: (1) a first layer of indium arsenide or aluminum arsenide, a second layer of indium arsenide, and a third layer of indium arsenide or gallium arsenide, or (2) a first layer of gallium arsenide or indium arsenide, a second layer of mercury telluride, cadmium telluride, or cadmium selenide, and a third layer of cadmium zinc telluride.

13. The method of claim 8, wherein the superconducting layer comprises one of lead, indium, tin, or aluminum.

14. The method of claim 8, wherein the substrate comprises one of indium phosphide, indium arsenide, indium antimonide, or indium arsenide antimonide.

15. A method for forming a semiconductor-superconductor hybrid device comprising:
   forming a semiconductor heterostructure over a substrate;
   forming a superconducting layer over the semiconductor heterostructure;
   exposing a first side of the semiconductor heterostructure and a second side, opposite to the first side, of the semiconductor heterostructure to allow for a formation of a first gate adjacent to the first side of the semiconductor heterostructure and for a formation of a second gate adjacent to the second side of the semiconductor heterostructure; and
   removing a first portion of the first gate and a second portion of the second gate such that each of a first top surface of the first gate and a second top surface of the second gate is offset vertically from a selected surface of the semiconductor heterostructure by a predetermined offset amount.

16. The method of claim 15, wherein the semiconductor-superconductor hybrid device is configured to form a horizontally-confined electrostatic channel in the semiconductor heterostructure in response to an application of an electric field to the semiconductor heterostructure via the first gate and the second gate.

17. The method of claim 16, wherein the predetermined offset amount is selected to ensure that the horizontally-confined electrostatic channel is formed at a selected distance from the selected surface of the semiconductor heterostructure to reduce an effect of any structural disorder associated with an interface of the superconducting layer with the semiconductor heterostructure.

18. The method of claim 17, wherein the structural disorder associated with the interface comprises line edge roughness (LER) associated with the superconducting layer.

19. The method of claim 18, wherein the horizontally-confined electrostatic channel comprises one of a 2-dimensional electron gas (2-DEG) channel or a 2-dimensional hole gas (2-DHG) channel.

20. The method of claim 15, further comprising forming a first terminal coupled to the first gate and forming a second terminal coupled to the second gate, to allow for an application of a first voltage to the first terminal and a second voltage to the second terminal.

* * * * *